United States Patent
Kasai et al.

(10) Patent No.: US 7,158,413 B2
(45) Date of Patent: Jan. 2, 2007

(54) SEMICONDUCTOR MEMORY DEVICE WITH MOS TRANSISTORS, EACH INCLUDING A FLOATING GATE AND A CONTROL GATE, A CONTROL METHOD THEREOF, AND A MEMORY CARD INCLUDING THE SAME

(75) Inventors: Nozomi Kasai, Yokohama (JP); Takuya Fujimoto, Yokohama (JP); Yoshiharu Hirata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 63 days.

(21) Appl. No.: 11/111,870

(22) Filed: Apr. 22, 2005

(65) Prior Publication Data

US 2005/0243628 A1 Nov. 3, 2005

(30) Foreign Application Priority Data

Apr. 23, 2004 (JP) ............................. 2004-128156

(51) Int. Cl.
*G11C 16/04* (2006.01)
(52) U.S. Cl. ........................... 365/185.18; 365/185.05; 365/185.13; 365/185.28
(58) Field of Classification Search .......... 365/185.05, 365/185.13, 185.18, 185.28
See application file for complete search history.

(56) References Cited

U.S. PATENT DOCUMENTS 5,894,437 A * 4/1999 Pellegrini .............. 365/185.13
6,477,087 B1 11/2002 Tanaka et al.
6,625,063 B1 9/2003 Kim
6,963,501 B1 * 11/2005 Shiga .................... 365/185.03
7,038,947 B1 * 5/2006 Chih ...................... 365/185.18

FOREIGN PATENT DOCUMENTS

JP 9-180453 7/1997

OTHER PUBLICATIONS

Wei-Hua Liu, et al., "A 2-Transistor Source-select (2TS) Flash EEPROM for 1.8V-Only Applications", Non-Volatile Semiconductor Memory Workshop, 4.1, 1997, pp. 1-3.

* cited by examiner

*Primary Examiner*—Hoai V. Ho
(74) *Attorney, Agent, or Firm*—Oblon, Spivak, McClelland, Maier & Neustadt, P.C.

(57) ABSTRACT

A semiconductor memory device includes memory cells, write bit lines, read bit lines, latch circuits, a n-channel MOS transistor, and voltage setting circuits. The memory cell includes a first MOS transistor having a charge accumulation layer and a control gate. The first MOS transistors are connected commonly to the write bit lines and read bit lines. The latch circuits are provided for the write bit lines and hold write data for the memory cells. The n-channel MOS transistor transfer "1" data to the latch circuits in a data latch operation. The voltage setting circuits supply a potential corresponding to "0" data to the write bit lines in a read operation. In a data latch operation, the latch circuit corresponding to the write bit line connected to the memory cell into which "0" data is to be written latches the potential supplied to the write bit lines in a read operation.

13 Claims, 28 Drawing Sheets

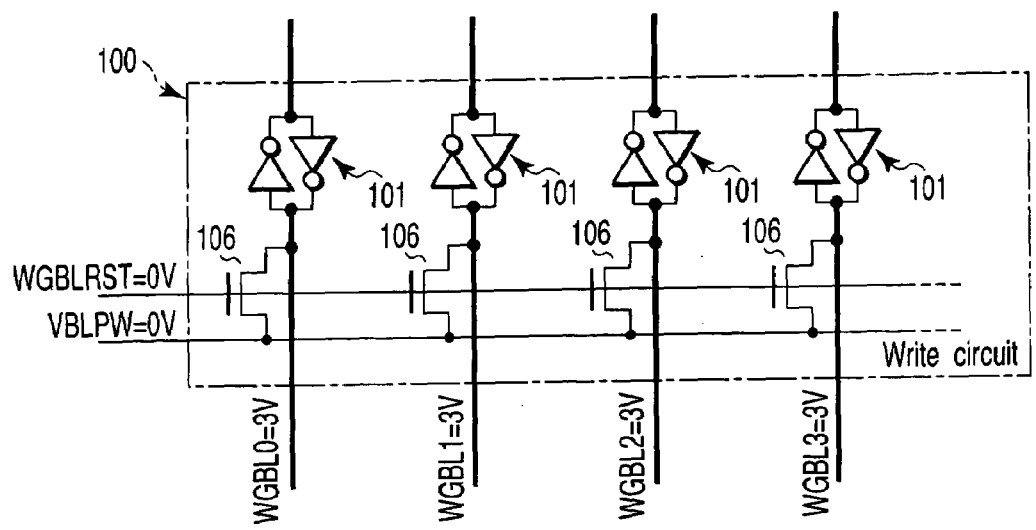
FIG. 23  BEFORE DATA LATCH OPERATION
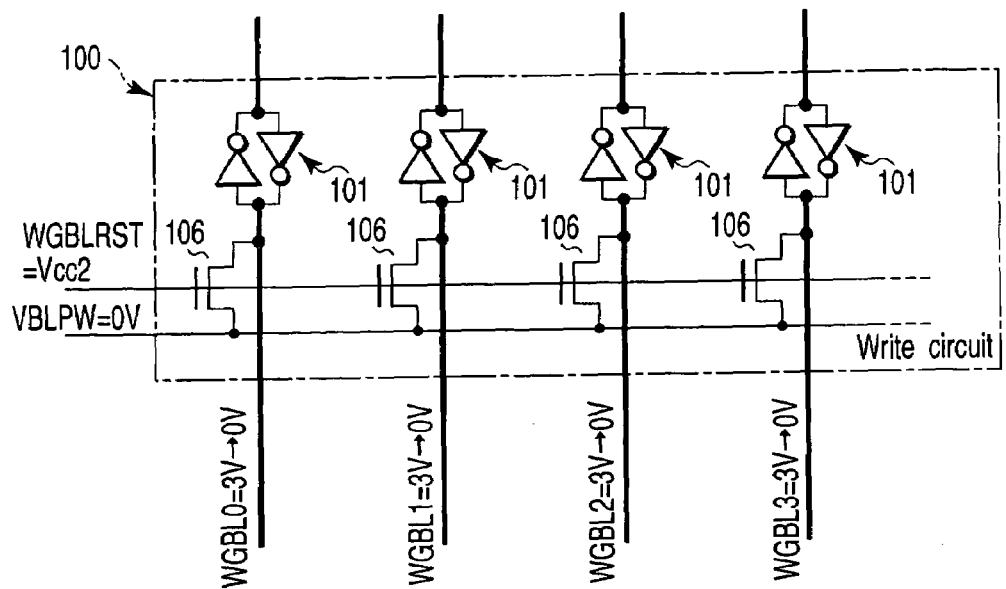
FIG. 24  BEFORE DATA LATCH OPERATION

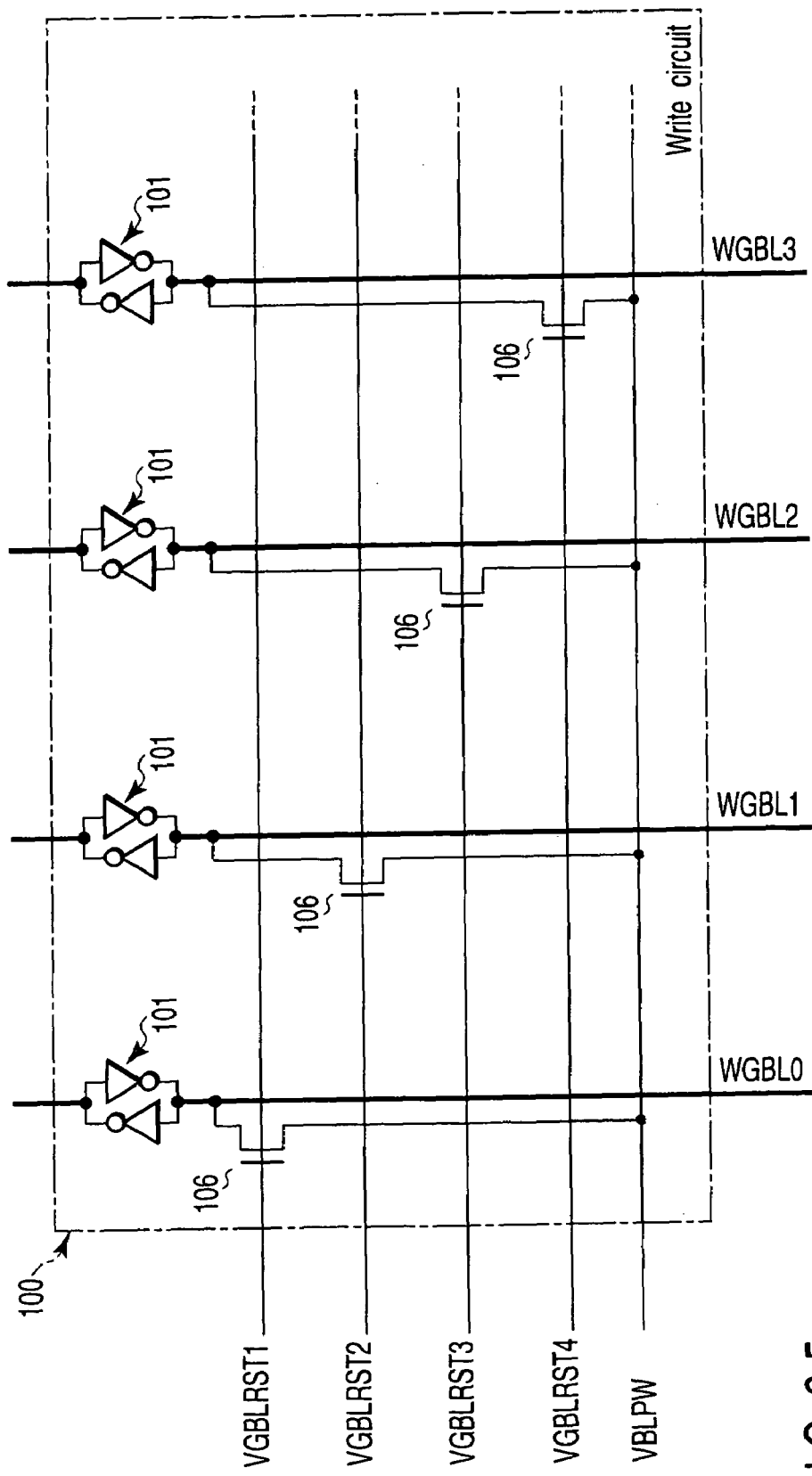
F I G. 25

SEMICONDUCTOR MEMORY DEVICE WITH MOS TRANSISTORS, EACH INCLUDING A FLOATING GATE AND A CONTROL GATE, A CONTROL METHOD THEREOF, AND A MEMORY CARD INCLUDING THE SAME

CROSS-REFERENCE TO RELATED APPLICATIONS

This application is based upon and claims the benefit of priority from prior Japanese Patent Application No. 2004-128156, filed Apr. 23, 2004, the entire contents of which are incorporated herein by reference.

BACKGROUND OF THE INVENTION

1. Field of the Invention

This invention relates to a semiconductor memory device and a control method for the semiconductor memory device. More particularly, this invention relates to a nonvolatile semiconductor memory device including MOS transistors, each having a floating gate and a control gate.

2. Description of the Related Art

NOR and NAND flash memories have been widely used as nonvolatile semiconductor memories.

In recent years, a flash memory combining the features of both the NOR and the NAND flash memory has been proposed in, for example, Wei-Hua Liu, "A 2-Transistor Source-select (2TS) Flash EEPROM for 1.8-V-Only Application," Non-Volatile Semiconductor Memory Workshop 4.1, 1997. A flash memory of this type has memory cells, each including two MOS transistors (hereinafter, referred to as a 2Tr flash memory). In a memory cell of a 2Tr flash memory, one MOS transistor functioning as a nonvolatile memory section has a structure including a control gate and a floating gate and is connected to a bit line. The other MOS transistor, which is connected to a source line, is used to select the memory cell.

Such a nonvolatile semiconductor memory device as the 2Tr flash memory described above has a write circuit for holding write data. A write circuit provided in a semiconductor memory has been disclosed in Jpn. Pat. Appln. KOKAI 9-180453. The size of the write circuit is relatively large and therefore miniaturization of LSI is difficult.

BRIEF SUMMARY OF THE INVENTION

A semiconductor memory device according to an aspect of the present invention includes: memory cells each of which includes a first MOS transistor having a charge accumulation layer and a control gate and into which data is written by exchanging electrons with the charge accumulation layer by FN tunneling, the first MOS transistor having one end of a current path and other end of the current path; write bit lines to each of which the one ends of the current paths of the first MOS transistors are connected electrically; read bit lines to each of which the one ends of the current paths of the first MOS transistors are connected electrically; latch circuits which are provided for the write bit lines in a one-to-one correspondence and which hold write data for the memory cells; a n-channel MOS transistor which transfer "1" data to the latch circuit in a data latch operation; and voltage setting circuits which apply a potential corresponding to "0" data to the write bit lines in a read operation, in the data latch operation, the latch circuits corresponding to the write bit line connected to the memory cell into which "0" data is to be written latching the potential applied to the write bit lines in the read operation.

A method of controlling a semiconductor memory device which includes a plurality of memory cells each including a first MOS transistor which has a charge accumulation layer and a control gate and writes data by exchanging electrons with the charge accumulation layer by FN tunneling, the method includes: setting to the ground potential the potential on write bit lines each of which connects commonly one ends of current paths of the first MOS transistors; reading data from any one of the memory cells in a memory cell array in which the memory cells are arranged in a matrix onto a read bit line which connects commonly the one ends of the current paths of the first MOS transistors; latching write data into the latch circuits provided so as to correspond the write bit lines, the latch circuits, when latching "1" data, latching "1" data externally supplied via n-channel MOS transistors, and when latching "0" data, latching the ground potential applied to the write bit lines before reading data; and writing the write data into any one of the memory cells connected to the write bit lines according to the write data latched in the write circuit.

BRIEF DESCRIPTION OF THE SEVERAL VIEWS OF THE DRAWING

FIGS. 23 and 24 are circuit diagrams of a part of a flash memory according to a fourth modification of each of the first to third embodiments;

FIG. 25 is a circuit diagram of a part of a flash memory according to a fifth modification of each of the first to third embodiments;

DETAILED DESCRIPTION OF THE INVENTION

Figure 1:
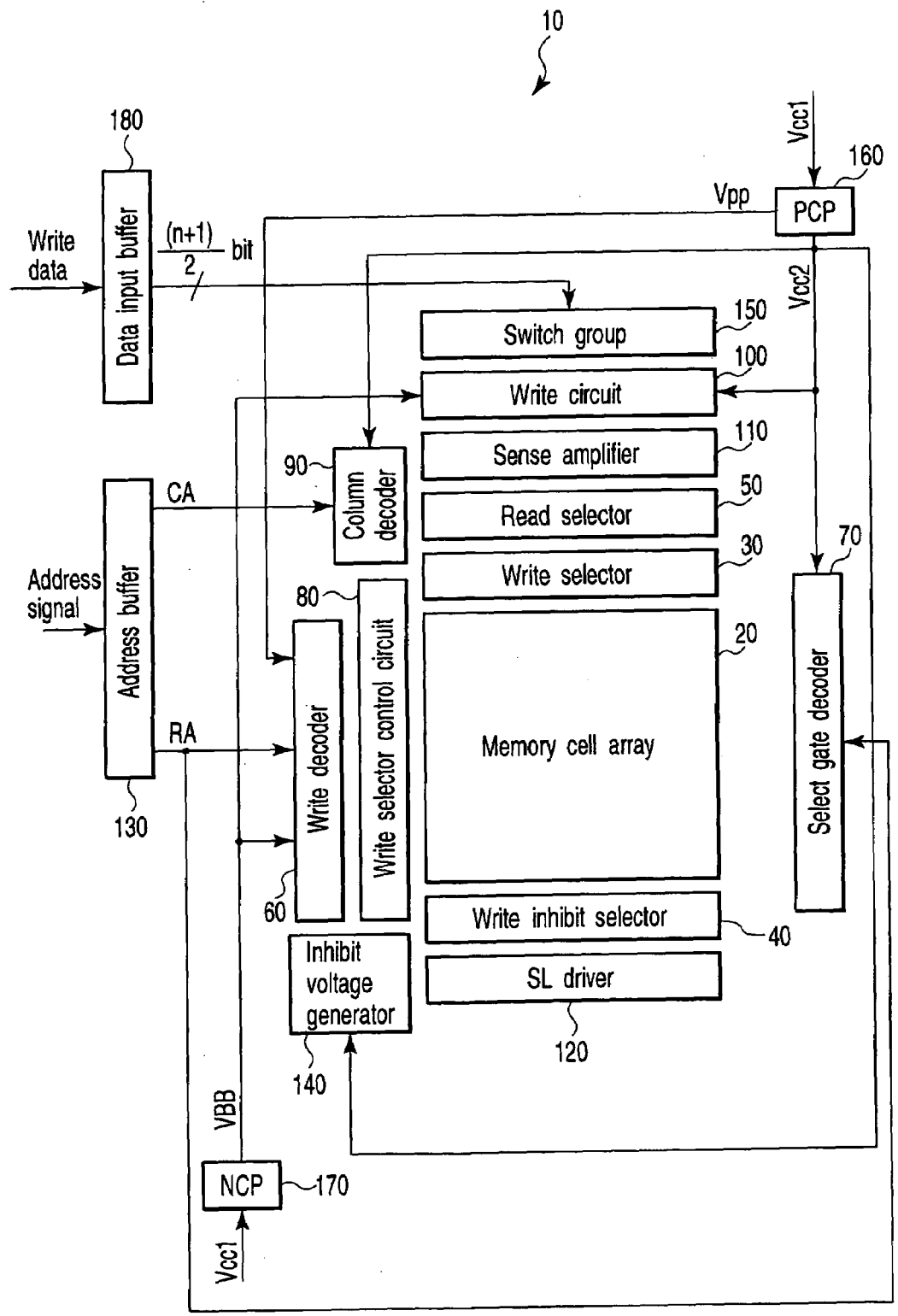
FIG. 1 is a block diagram of a flash memory according to a first embodiment of the present invention.

Using FIG. 1, a semiconductor memory device according to a first embodiment of the present invention and a control method for the semiconductor memory device will be explained. FIG. 1 is a block diagram of a 2Tr flash memory according to the first embodiment.

As shown in FIG. 1, a flash memory 10 comprises a memory cell array 20, a write selector 30, a write inhibit selector 40, a write selector 50, a write decoder 60, a select gate decoder 70, a selector control circuit 80, a column decoder 90, a write circuit 100, a sense amplifier 110, a source line driver 120, an address buffer 130, a write inhibit voltage generator 140, a switch group 150, boosting circuits 160, 170, and a data input buffer 180.

Figure 2:
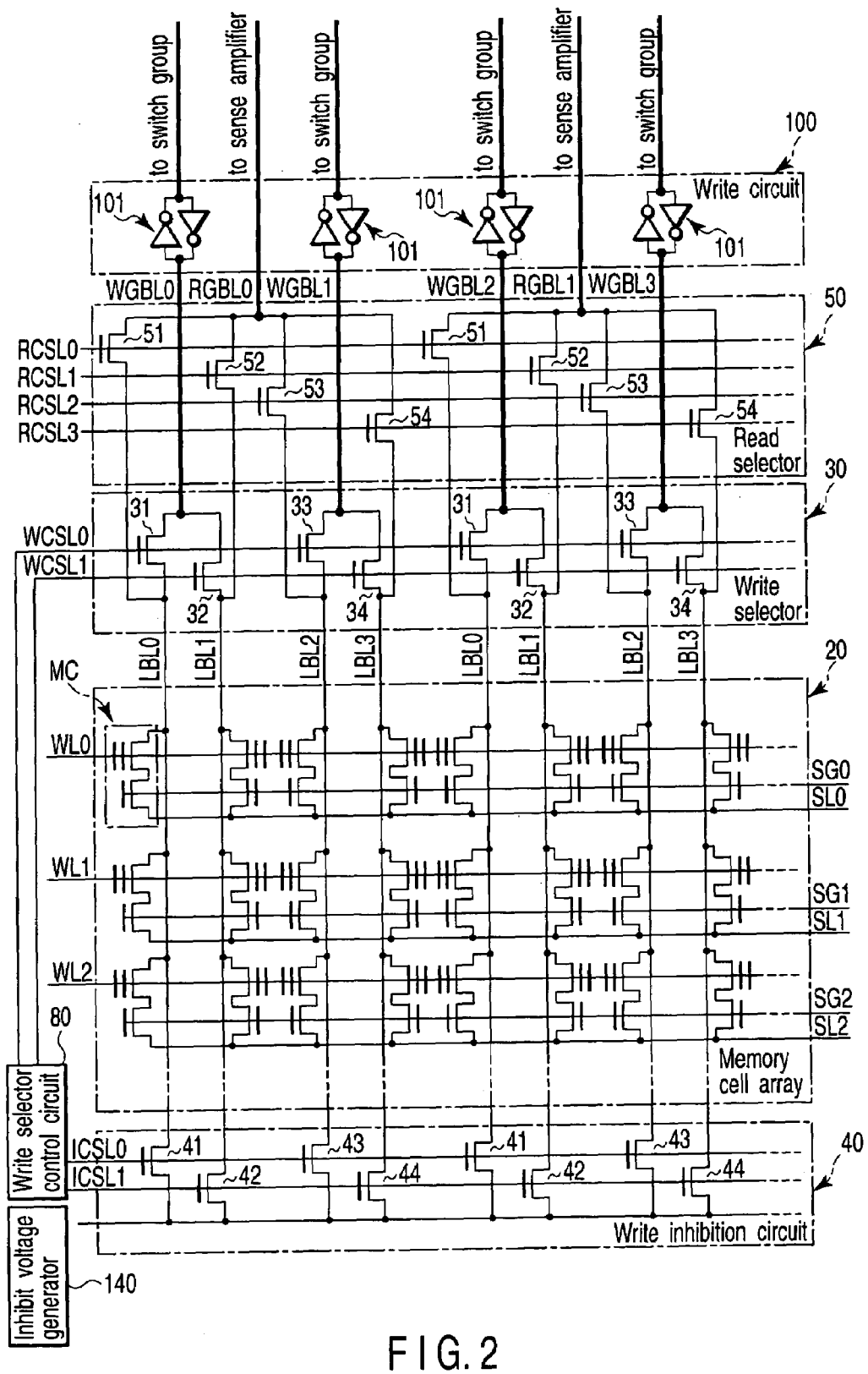
FIG. 2 is a circuit diagram of a part of the flash memory according to the first embodiment.

The memory cell array 20, write selector 30, write inhibit selector 40, read selector 50, and write circuit 100 will be explained using FIG. 2.

The memory cell array 20 has ((m+1)×(n+1)) memory cells MC (m and n are natural numbers). Each of the memory cells MC includes a memory cell transistor MT and a select transistor ST, which have their current paths connected in series. The memory cell transistor MT has a stacked gate structure that includes a floating gate formed above a semiconductor substrate via a gate insulating film and a control gate formed above the floating gate via an inter-gate insulating film. The source of the memory cell transistor MT is connected to the drain of the select transistor ST. The drain regions of the memory cell transistors MT in four columns of memory cells are connected to four local bit lines LBL0 to LBL3, respectively. The memory cell array 20 includes a plurality of sets of the four columns of memory cells and local bit lines LBL0 to LBL3 connected to the respective columns of memory cells. One end of each of local bit lines LBL0 to LBL3 is connected to the write selector 30 and read selector 50. The other ends of local bit lines LBL0 to LBL3 are connected to the write inhibit selector 40. Moreover, in the memory cell array 20, the control gates of the memory cell transistors MT in a row are connected commonly to any one of word lines WL0 to WLm. The gates of the select transistors in a row are connected commonly to any one of select gate lines SG0 to SGm. Word lines WL0 to WLm are connected to the write decoder 60 and select gate lines SG0 to SGm are connected to the select gate decoder 70. The source regions of the select transistors ST are connected commonly to a source line SL and further connected to the source line driver 120.

The write selector 30 includes a plurality of MOS transistors 31 to 34 provided for local bit lines LBL0 to LBL3 in a one-to-one correspondence. One end of the current path of each of the MOS transistors 31 to 34 is connected to the corresponding one of local bit lines LBL0 to LBL3. The other ends of the current paths of the MOS transistors 31, 32 and the other ends of the current paths of the MOS transistors 33, 34 are connected to write global bit lines WGBL0 to WGBL((n+1)/2)−1). In addition, the gates of the MOS transistors 31, 33 and the gates of the MOS transistors 32, 34 are connected to write column select lines WCSL0, WCSL1, respectively.

Specifically, in the write selector 30, four MOS transistors 31 to 34 are provided for a set of four local bit lines LBL0 to LBL3. Local bit lines LBL0, LBL1 pass through the MOS transistors 31, 32 respectively and are connected to a write global bit line. Local bit lines LBL2, LBL3 pass through the MOS transistors 33, 34 respectively and are connected to another write global bit line. Of the MOS transistors 31 to 34, the gates of the MOS transistors 31, 33 are connected to a common write column select line. The gates of the MOS transistors 32, 34 are connected to another common write column select line.

The read selector 50 includes a plurality of MOS transistors 51 to 54 provided for local bit lines LBL0 to LBL3 in a one-to-one correspondence. One end of the current path of each of the MOS transistors 51 to 54 is connected to the corresponding one of local bit lines LBL0 to LBL3. The other ends of the current paths of the MOS transistors 51 to 54 are connected to read global bit lines RGBL0 to RGBL(((n+1)/4)−1). The gates of the MOS transistors 51 to 54 are connected to read column select lines RCSL0 to RCSL3, respectively.

Specifically, in the read selector 50, four MOS transistors 51 to 54 are provided for a set of four local bit lines LBL0 to LBL3. Local bit lines LBL0 to LBL3 pass through the MOS transistors 51 to 54 respectively and are connected to a single read global bit line. The gates of the MOS transistors 51 to 54 connected to the same read global bit lines are connected to different read column select lines in a one-to-one correspondence.

The write inhibit selector 40 includes a plurality of MOS transistors 41 to 44 provided for local bit lines LBL0 to LBL3 in a one-to-one correspondence. One end of the current path of each of the MOS transistors 41 to 44 is connected to the corresponding one of local bit lines LBL0 to LBL3. The other ends of the MOS transistors 41 to 44 are connected to one another and then connected to the write inhibit voltage generator 140. The gates of the MOS transistors 41, 43 are connected to write column select line ICSL0. The gates of the MOS transistors 42, 44 are connected to write column select line ICSL1.

Specifically, in the write inhibit selector 30, four MOS transistors 41 to 44 are provided for a set of four local bit lines LBL0 to LBL3. Local bit lines LBL0 to LBL3 pass through the MOS transistors 41 to 44 respectively and are connected to the write inhibit voltage generator 140. The gates of the MOS transistors 41, 43 electrically connected to a global bit line are connected to a common write inhibit column select line. The gates of the MOS transistors 42, 44 electrically connected to another global bit line are connected to another common write inhibit column select line.

As described above, one write global bit line is provided for every two local bit lines and one read global bit line is provided for every four local bit lines.

The write circuit 100 includes latch circuits 101 provided for write global bit lines WGBL0 to WGBL(((n+1)/2)−1) in a one-to-one correspondence. Each of the latch circuits holds data to be written into the memory cell connected to the corresponding one of write global bit lines WGBL0 to WGBL(((n+1)/2)−1).

Referring to FIG. 1, the explanation will be continued.

The write decoder 60 selects any one of word lines WL0 to WLm in a write operation and supplies a voltage to the selected word line. In a write operation, the write decoder 60 applies a negative voltage to all of select gate lines SG0 to SGm. In addition, the write decoder 60 applies a voltage to the well region in which the memory cell array 20 is formed.

The select gate decoder 70, in a read operation, selects any one of select gate lines SG0 to SGm and supplies a voltage to the selected select gate line.

The selector control circuit 80 controls the write selector 30 and write inhibit selector 40. Specifically, the selector control circuit 80, in a write operation, selects one of write column select lines WCSL0, WCSL1 and one of write inhibit column select lines ICSL0, ICSL1 and applies a voltage to the selected column select lines.

The column decoder 90 controls the read selector. Specifically, the column decoder 90, in a read operation, selects any one of read column select lines RCSL0 to RCSL3 and applies a voltage to the selected column select line.

The sense amplifier 110 amplifies the data read from the memory cell array 20.

The source line driver 120 supplies a voltage to the source lines.

The address buffer 130 holds an address signal. Then, the address buffer 120 supplies a column address signal CA to the column decoder 90 and a row address signal RA to the write decoder 60 and select gate decoder 70.

The write inhibit voltage generator 140 supplies a write inhibit voltage Vinhibit to the unselected local bit lines in a write operation.

The boosting circuit 160 generates a positive potential. Specifically, the boosting circuit 160 raises an externally input voltage Vcc1 (1.25 to 1.65V) to an internal voltage Vcc2 (2.5 to 3.6V). Then, the boosting circuit 160 supplies the internal voltage Vcc2 to the select gate decoder 70, column decoder 90, write circuit 100, and write inhibit voltage generator 140. Moreover, the boosting circuit 160 raises Vcc1 to an internal voltage VPP (e.g., 10V) and supplies the internal voltage VPP to the write decoder 60.

The boosting circuit 170 generates a negative potential. Specifically, on the basis of the externally input voltage Vcc1, the boosting circuit 170 generates an internal voltage VBB. The internal voltage VBB is, for example, −7V. Then, the boosting circuit 170 supplies the internal voltage VBB to the write decoder 60 and write circuit 100.

The data input buffer 180 holds externally input write data.

The switch group 150 transfers the write data input to the data input buffer 180 to the write circuit 100.

Next, the details of the write circuit 100 and the configuration of the switch group 150 and data input buffer 180 will be explained using FIG. 3.

First, the write circuit 100 will be explained. The write circuit 100 includes latch circuit 101 and reset transistors (n-channel MOS transistors) 106 provided for WGBL0 to WGBL(((n+1)/2)−1) in a one-to-one correspondence.

Each of the latch circuits 101 includes two inverters 102, 103. The input terminal of the inverter 102 is connected to the output terminal of the inverter 103. The output terminal of the inverter 102 is connected to the input terminal of the inverter 103. The junction node of the input terminal of the inverter 102 and the output terminal of the inverter 103 makes the output node of the latch circuit 101, which is connected to the corresponding write global bit line. Each of the inverters 102, 103 has an n-channel MOS transistor 104 and a p-channel MOS transistor 105 whose current paths are connected in series. The source of the n-channel MOS transistor 104 is connected to VBLPW node and the source of the p-channel MOS transistor 105 is connected to VPI node. That is, the inverters 102, 103 operate using the potentials at VBLPW node and VPI node as the low-voltage-side and high-voltage-side power supply voltages. The gate of the n-channel MOS transistor 104 and the gate of the p-channel MOS transistor 105 are connected to one another. Then, the junction node of the drain of the p-channel MOS transistor 105 and the drain of the n-channel MOS transistor 104 in the inverter 103 is connected to the junction node of the gate of p-channel MOS transistor 105 and the gate of n-channel MOS transistor 104 in the inverter 102 and is further connected to the corresponding write global bit line. In addition, the junction node of the drain of the p-channel MOS transistor 105 and the drain of the n-channel MOS transistor 104 in the inverter 102 is connected to the junction node of the gate of the p-channel MOS transistor 105 and the gate of the n-channel MOS transistor 104 in the inverter 103. This junction node makes the input node of the latch circuit 101. Write data is input to the input node.

A VBLPW node is connected by the switch element 107 to either the output node to which the boosting circuit 170 outputs the negative voltage VBB (−7V) or the ground potential. A VPI node is connected by the switch element 108 to either the output node to which the boosting circuit 160 outputs the positive voltage Vcc2 (about 3V) or the ground potential. That is, the inverters 102, 103 operate using Vcc2 and the ground potential as power supply voltages or the ground potential and VBB as power supply voltages.

The reset transistors 106 are provided for write global bit lines WGBL0 to WGBL(((n+1)/2)−1) in a one-to-one correspondence. Each of the reset transistors 106 has its source connected to the VBLPW node, its drain connected to the corresponding write global bit line, and its gate connected to WGBLRST.

The switch group 150 includes n-channel MOS transistors 151 provided for the latch circuits 101 in a one-to-one correspondence. One end of the current path of each of the MOS transistors 151 is connected to the data input buffer 180. The other end of the current path is connected to the input node of the corresponding one of the latch circuits 101. The gate of the MOS transistor 151 is connected to the WDH node.

The data input buffer 180 includes inverters 181 provided for the latch circuits 101 in a one-to-one correspondence. The output node of each of the inverters 181 is connected to one end of the current path of the corresponding one of the n-channel MOS transistors 151. Write data is input to the other terminal of the inverter 181.

Hereinafter, the output node of the inverter 181 may be referred to as the TOWDI node and the input node of the latch circuit 101 as node A.

Figure 4:
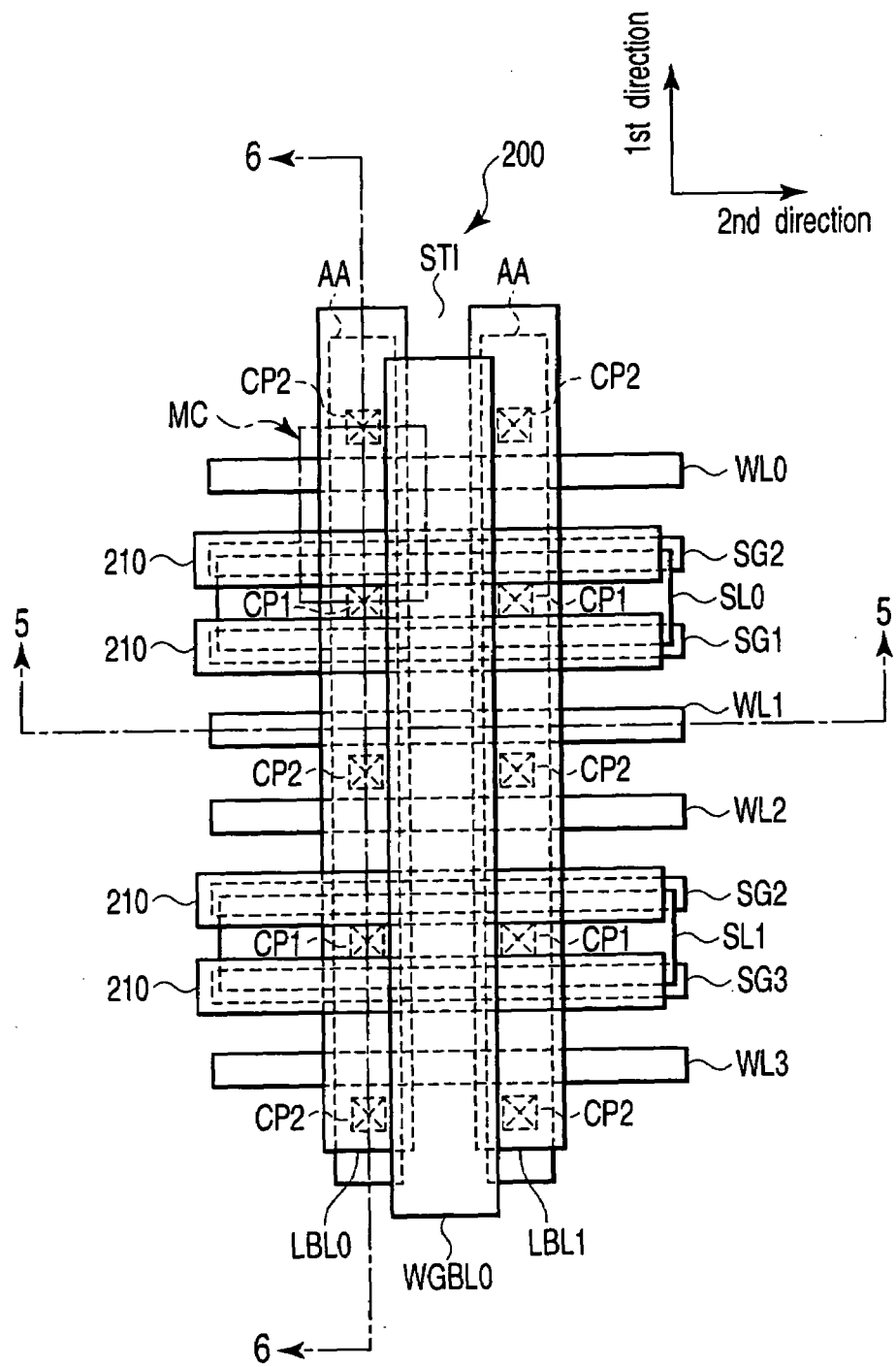
FIG. 4 is a plan view of a part of a memory cell array included in the flash memory of the first embodiment.

Next, a plane pattern of the memory cell array included in the flash memory of FIG. 2 will be explained. FIG. 4 is a plan view of a region including the memory cells connected to write global bit line WGBL0 and word lines WL0 to WL3.

As shown in FIG. 4, in the semiconductor substrate 200, a plurality of strip-shaped element regions AA extending in a first direction are formed in a second direction perpendicular to the first direction. Strip-shaped word lines WL0 to WL3 and select gate lines SG0 to SG3, which extend in the second direction, are formed so as to cross the element regions AA. In the regions where word lines WL0 to WL3 cross the element regions AA, memory cell transistors MT (not shown) are formed. In the regions where select gate lines SG0 to SG3 cross the element regions AA, select transistors ST (not shown) are formed. Moreover, in the regions where word lines WL0 to WL3 cross the element regions AA, floating gates (not shown) are formed in such a manner that they are separated from one another on a memory cell transistor basis.

Above two adjacent select gate lines SG0, SG1 and another two adjacent select gate lines SG2, SG3, strip-shaped source lines SL are formed. The source line SL is connected electrically to the source region of the select transistor ST by a contact plug CP1. Strip-shaped local bit lines LBL0, LBL1 extending in the first direction are formed so as to almost overlap with the element region AA. One end of each of local bit lines LBL0, LBL1 is connected to the write selector 30, whereas the other end is connected to the write inhibit selector 40 and further connected to the drain region of the corresponding one of the memory cell transistors MT by a contact plug CP2. In the region directly above each of select gate lines SG0 to SG3, a strip-shaped metal wiring layer 210 extending in the second direction is formed. The metal wiring layers 210, which function as shunt wires for select gate lines SG0 to SG3, are connected to select gate lines SG0 to SG3 in specific regions (not shown) by contact plugs. Moreover, at a level higher than that of the shunt wires, a strip-shaped metal wiring layer extending in the first direction is formed. The metal wiring layer functions as write global bit line WGBL0.

Figure 5:
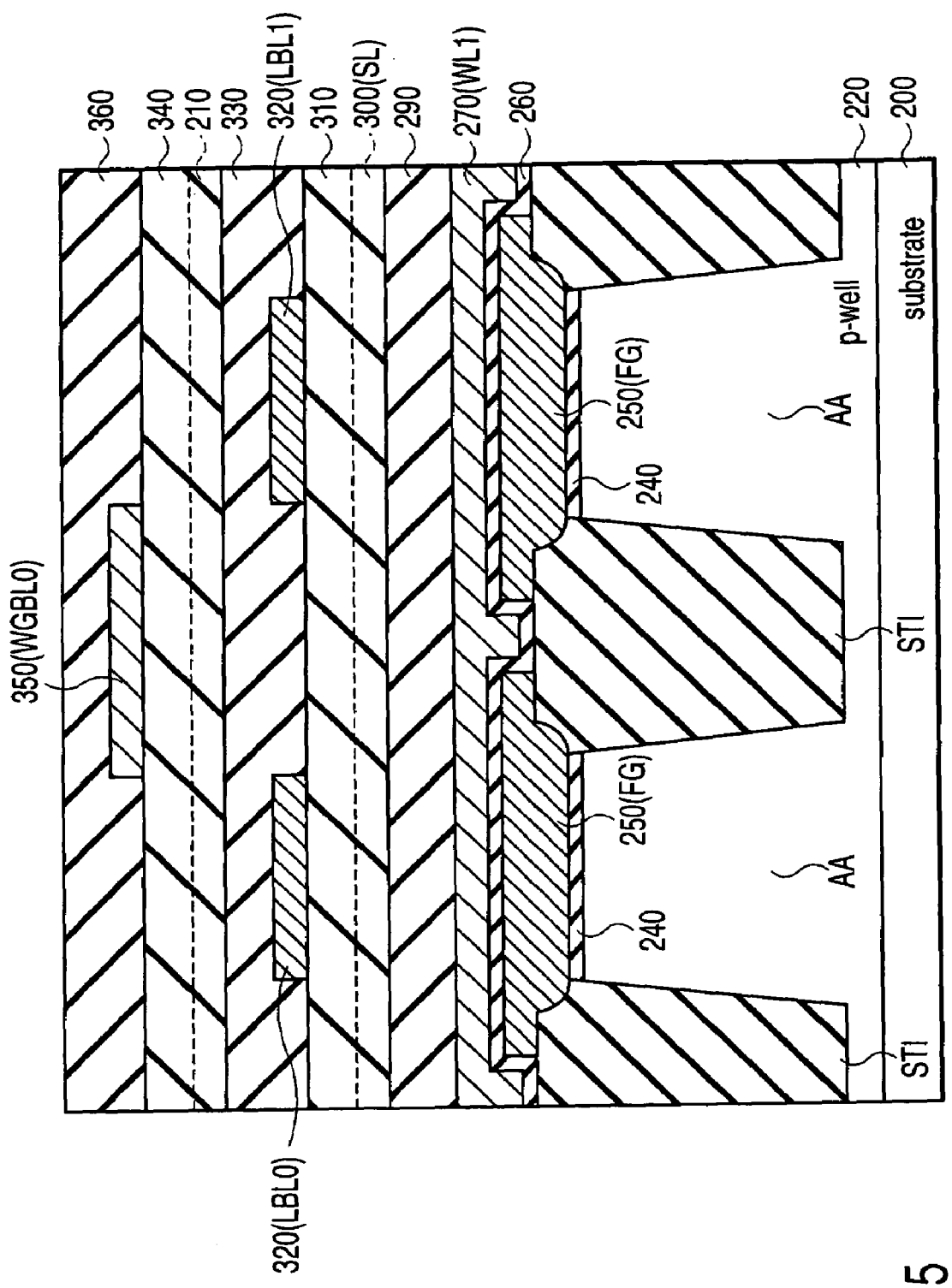
FIG. 5 is a sectional view taken along line 5—5 of FIG. 4.
Figure 6:
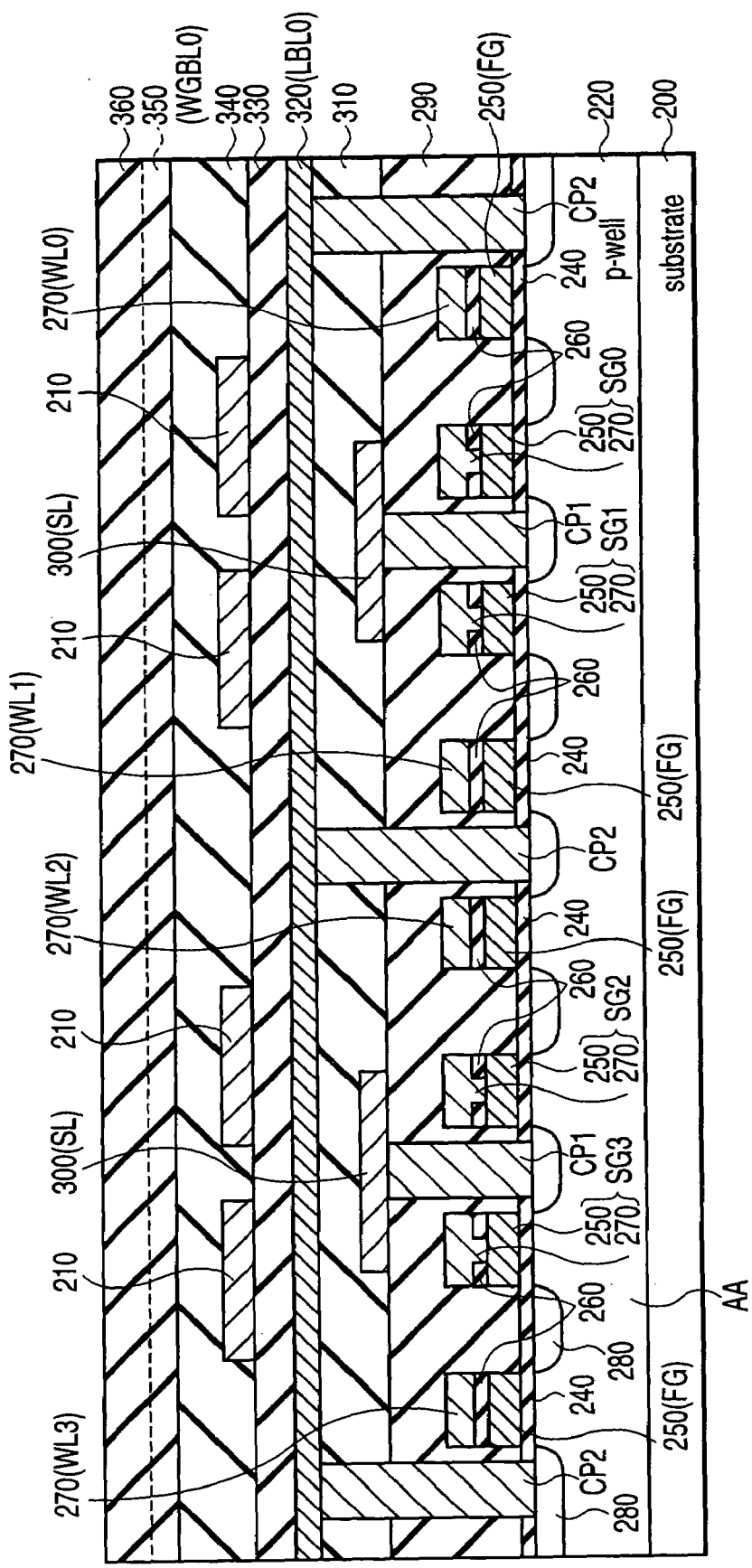
FIG. 6 is a sectional view taken along line 6—6 of FIG. 4.

Next, a sectional structure of the memory cell array will be explained using FIGS. 5 and 6. FIG. 5 is a sectional view taken along line 5—5 of FIG. 4. FIG. 6 is a sectional view taken along line 6—6.

As shown in the figures, at the surface of the semiconductor substrate 200, a p-well region 220 is formed. In the p-well region 200, an element isolating region STI is formed. The region surrounded by the element isolating region STI is an element region AA. On the element region AA of the semiconductor substrate 200, a gate insulating film 240 is formed. On the gate insulating film 240, the gate electrodes of a memory cell transistor MT and a select transistor ST are formed. Each of the gate electrodes of the memory cell transistor MT and select transistor ST includes a polysilicon layer 250 formed on the gate insulating film 240, an inter-gate insulating film 260 formed on the polysilicon layer 250, and a polysilicon layer 270 formed on the inter-gate insulating film 260. The inter-gate insulating film 260 is made of, for example, a silicon oxide film, or an ON film, NO film, or ONO film having a stacked structure of a silicon oxide film and a silicon nitride film. As shown in FIG. 5, in a memory cell transistor MT, the polysilicon layers 250, which are separated from one another between adjacent element regions AA, function as floating gates. The polysilicon layers 270, which are connected to word lines WL, function as control gates. The polysilicon layers 270 are connected to one another between adjacent element regions AA. In a select transistor ST, the polysilicon layers 250 are connected to one another between adjacent element regions AA. A part of each of the inter-gate insulating films 260 is removed. The polysilicon layers 250, 270 are connected electrically. Then, the polysilicon layers 250, 270 are connected to the select gate lines SG. In a select transistor, too, the polysilicon layers 270 are connected to one another between adjacent element regions AA. At the surface of the semiconductor substrate 200 between adjacent gate electrodes, an impurity diffused layer 280 is formed. The impurity diffused layer 280 is shared by adjacent transistors.

A memory cell MC including a memory cell transistor MT and a select transistor ST is formed so as to have the following relationship. In adjacent memory cells MC, MC, their select transistors ST or their memory cell transistors MT are adjacent to each other. The adjacent select transistors or memory cell transistors share the impurity diffused layer. Therefore, two adjacent memory cells MC, MC, when their select transistors ST are adjacent to each other, are arranged symmetrically with the impurity diffused layer 280 shared by the two select transistors ST, ST. Conversely, when their memory cell transistors MT are adjacent to each other, two adjacent memory cells MC, MC are arranged symmetrically with the impurity diffused layer 280 shared by the two memory cell transistors MT, MT.

Then, on the semiconductor substrate 200, an interlayer insulating film 290 is formed so as to cover the memory cell transistor MT and select transistor ST. In the interlayer insulating film 290, a contact plug CP1 reaching the impurity diffused layer (or source region) 280 shared by two select transistors ST, ST is formed. On the interlayer insulating film 290, a metal wiring layer 300 connected to the contact plug CP1 is formed. The metal wiring layer 300 functions as a source line SL.

On the interlayer insulating film 290, an interlayer insulating film 310 is formed so as to cover the metal wiring layer 300. A contact plug CP2 is formed which runs from the surface of the interlayer insulating film 310, passes through the interlayer insulating film 290, and reaches the impurity diffused layer (drain region) 280 of the memory cell transistor MT. On the interlayer insulating film 310, a metal wiring layer 320 connected equally to a plurality of contact plugs CP2 is formed. The metal wiring layer 320 functions as local bit lines LBL0, LBL1.

On the interlayer insulating film 310, an interlayer insulating film 330 is formed so as to cover the metal wiring layer 320. On the interlayer insulating film 330, a metal wiring layer 210 is formed. The metal wiring layer 210 functions as a shunt wire for the gate of a select transistor ST. Thus, in a specific region (not shown), a contact plug is formed which runs from the surface of the interlayer insulating film 330 and reaches the gate electrode 270 of a select transistor ST. Via the contact plug, the gate electrode 270 of the select transistor ST is connected electrically to the metal wiring layer 210.

On the interlayer insulating film 330, an interlayer insulating film 340 is formed so as to cover the metal wiring layer 210. On the interlayer insulating film 340, a metal wiring layer 350 is formed. The metal wiring layer 350 functions as write global bit line WGBL0. On the interlayer insulating film 340, an interlayer insulating film 360 is formed so as to cover the metal wiring layer 350.

Figure 7:
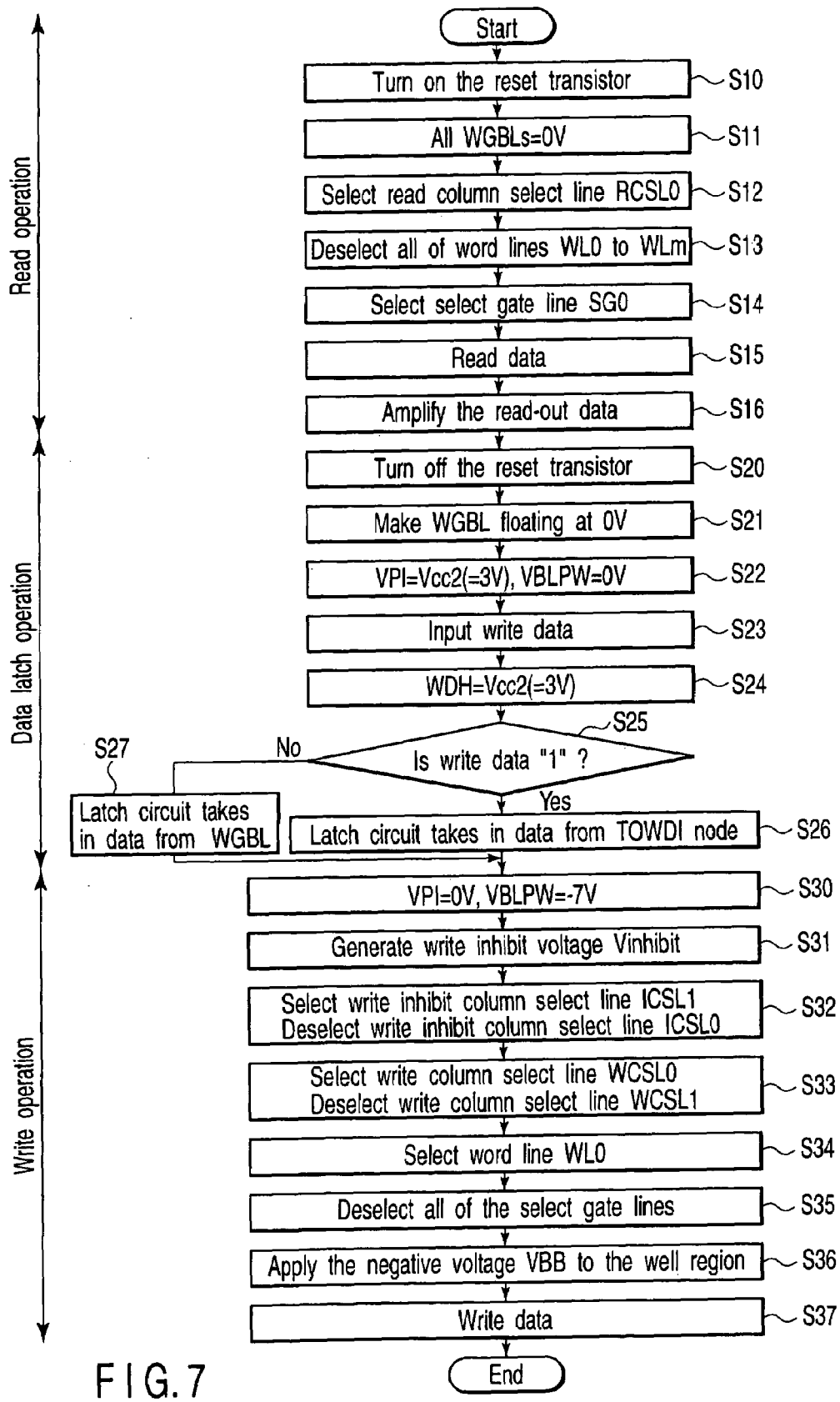
FIG. 7 is a flowchart for a read operation, a data latch operation, and a write operation in the flash memory of the first embodiment.
Figure 8:
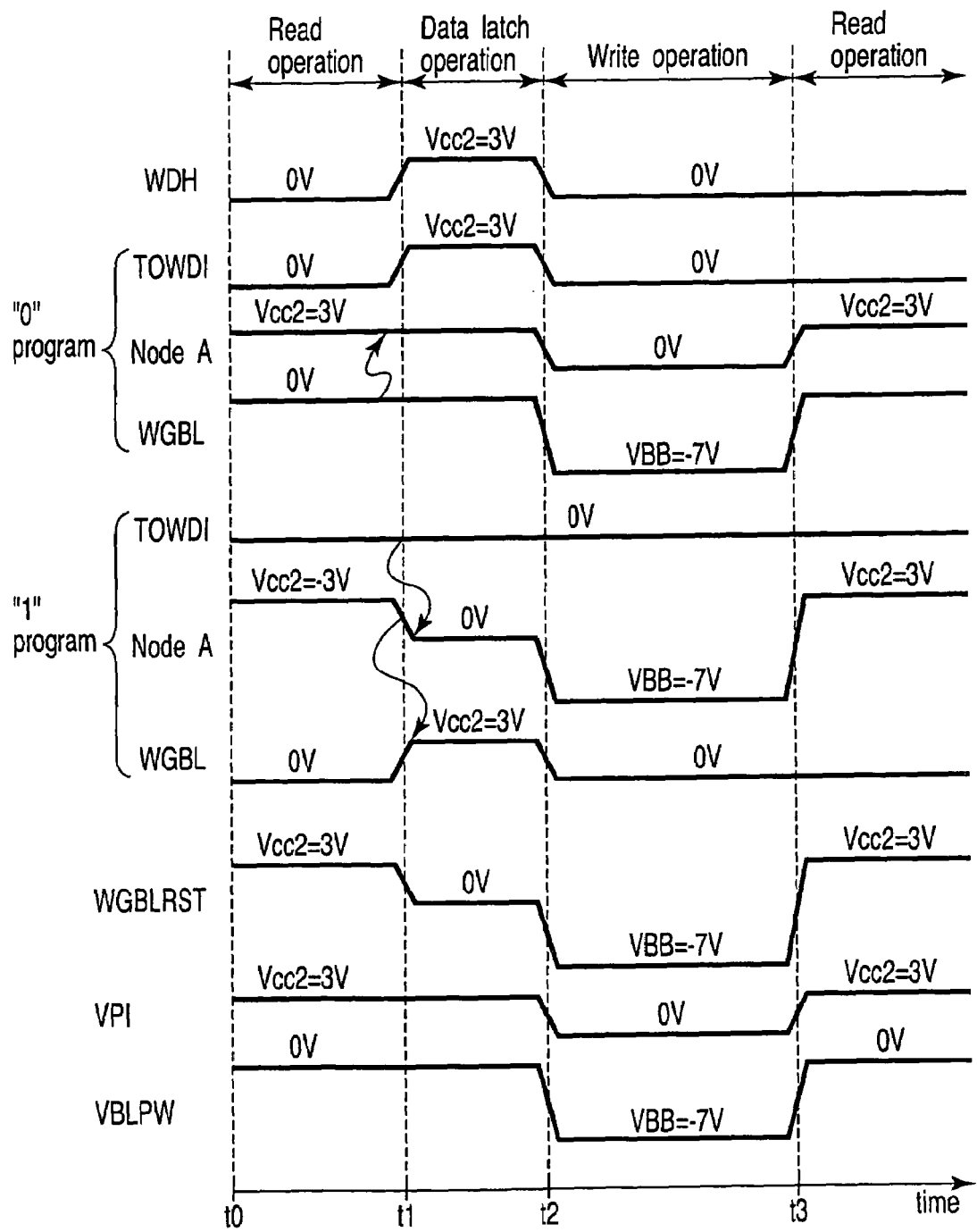
FIG. 8 is a timing chart for various signals in a read operation, a data latch operation, and a write operation in the flash memory of the first embodiment.

Next, the operation of the flash memory configured as described above will be explained. Hereinafter, not only the flow from a read operation to a data latch operation and to a write operation but also an erase operation will be explained. Using FIGS. 7 and 8, a read operation to a write operation will be described. FIG. 7 is a flowchart for a read operation, a data latch operation, and a write operation. FIG. 8 is a timing chart to help explain the potentials at the WDH node, TOWDI node, and node A, on write global bit line WGBL, at the WGBLRST node, VPI node, and VBLPW node in a read operation, a data latch operation, and a write operation. As for the TOWDI node, node A, and write global bit line WGBL, both of a "0" write operation and a "1" write operation will be explained.

<Read Operation>

Figure 9:
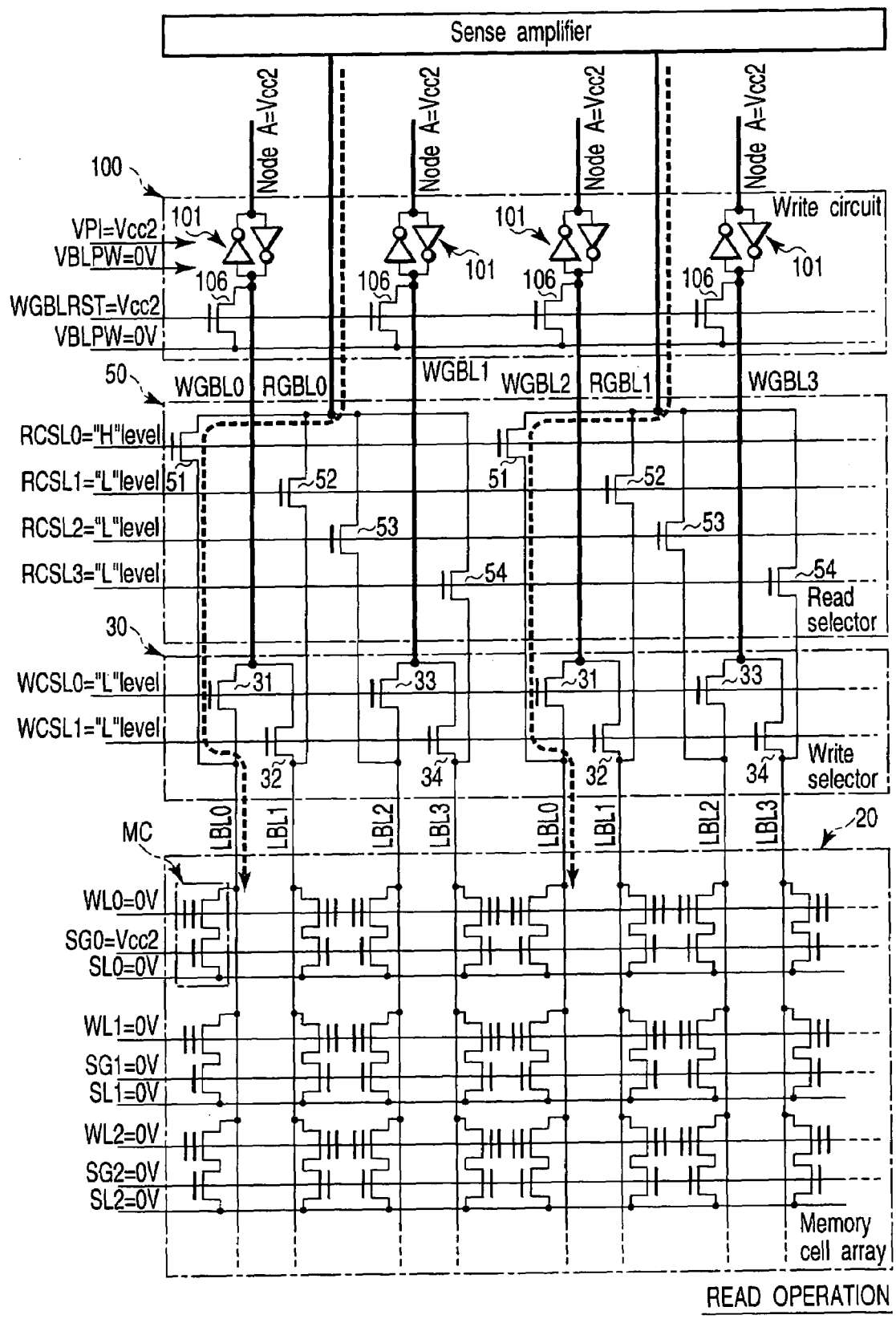
FIG. 9 is a circuit diagram of a part of the flash memory according to the first embodiment, which helps explain a read operation.

In a read operation, the data can be read simultaneously from a plurality of memory cells connected to any one of the word lines. More specifically, of the memory cells connected to any one of the word lines, the data can be read simultaneously from the memory cells connected to any one of local bit lines LBL0 to LBL3. Hereinafter, using FIGS. 7 to 9, a case where the data is read from the memory cells MC connected to word line WL0 and local bit line LBL0 will be explained. FIG. 9 is a circuit diagram of the memory cell array in a read operation.

First, 0V is applied to the WDH node. As a result, the data input buffer 180 is isolated electrically from the write circuit 100. In addition, Vcc2 is applied to the WGBLRST node and 0V is applied to the VBLPW node, which turns on the reset transistor 101 in the write circuit 100 (step S10). As a result, the potentials on all of the write global bit lines (((n+1)/2)–1) go to 0V (step S11).

The selector control circuit 80 makes write inhibit column select lines ICSL0, ICSL1 and write column select lines WCSL0, WCSL1 unselected. That is, "L" (low) level (0V) is applied to write inhibit column select lines ICSL0, ICSL1 and write column select lines WCSL0, WCSL1. Accordingly, the MOS transistors 41 to 44 in the write inhibit selector 40 and the MOS transistors 31 to 34 in the write selector 30 are all turned off. As a result, local bit lines LBL0 to LBL3 are isolated electrically from the write inhibit voltage generator 140 and write global bit lines WGBL0 to WGBL(((n+1)/2)–1).

The column decoder 90 selects any one of read column select lines RCSL0 to RCSL3 on the basis of the column address signal input from the address buffer 130. In the example of FIG. 9, the column decoder 90 selects read column select line RCSL0 (step S12). Specifically, the column decoder 90 applies an "H" (high) level (Vcc2) to read column select line RCSL0 and a "L" (low) level (0V) to read column select lines RCSL1 to RCSL3. Accordingly, the MOS transistor 51 in the read selector 50 is turned on. As a result, local bit line LBL0 is connected to read global bit lines RGBL0 to RGBL(((n+1)/4)–1). On the other hand, local bit lines LBL1 to LBL3 are electrically isolated from read global bit lines RGBL0 to RGBL(((n+1)/4)–1).

The write decoder 60 applies 0V to all of word lines WL0 to WLm (step S13). The source line driver 120 sets the potential on the source lines at 0V. The select gate decoder 70 selects any one of select gate lines SG0 to SGm. In the example of FIG. 9, the select gate decoder 70 selects select gate line SG0 and applies Vcc2 to select gate line SG0 (step S14) and. 0V to the other select gate lines SG1 to SGm. As a result, the select transistors ST connected to the selected select gate line SG0 are turned on and the select transistors ST connected to the unselected select gate lines are turned off. At this time, select gate lines SG0 to SGm are electrically isolated from the write decoder 60.

As a result, local bit line LBL0 is connected to the sense amplifier 110 via the MOS transistor 51 in the read selector 50 and read global bit lines RGBL0 to RGBL (((n+1)/4)–1).

Then, for example, about 1V to 3V is applied to read global bit lines RGBL0 to RGBL(((n+1)/4)–1). Since the memory cell transistor MT in the memory cell MC in which "1" data has been written has a negative threshold voltage, it is turned on. Therefore, in the memory cell MC connected to the selected select gate line SG0, current flows from read global bit lines RGBL0 to RGBL(((n+1)/4)–1) to the source line SL via local bit line LBL0, memory cell transistor MT, and select transistor ST. On the other hand, since the memory cell transistor MT in the memory cell MC in which "0" data has been written has a positive threshold voltage, it is turned off. Thus, no current flows in read global bit lines RGBL0 to RGBL(((n+1)/4)–1).

As described above, the potentials on read global bit lines RGBL0 to RGBL(((n+1)/4)–1) vary, which enables the data to be read (step S15). The variation is amplified by the sense amplifier 110 (step S16), thereby carrying out the read operation.

<Data Latch Operation>

Figure 10:
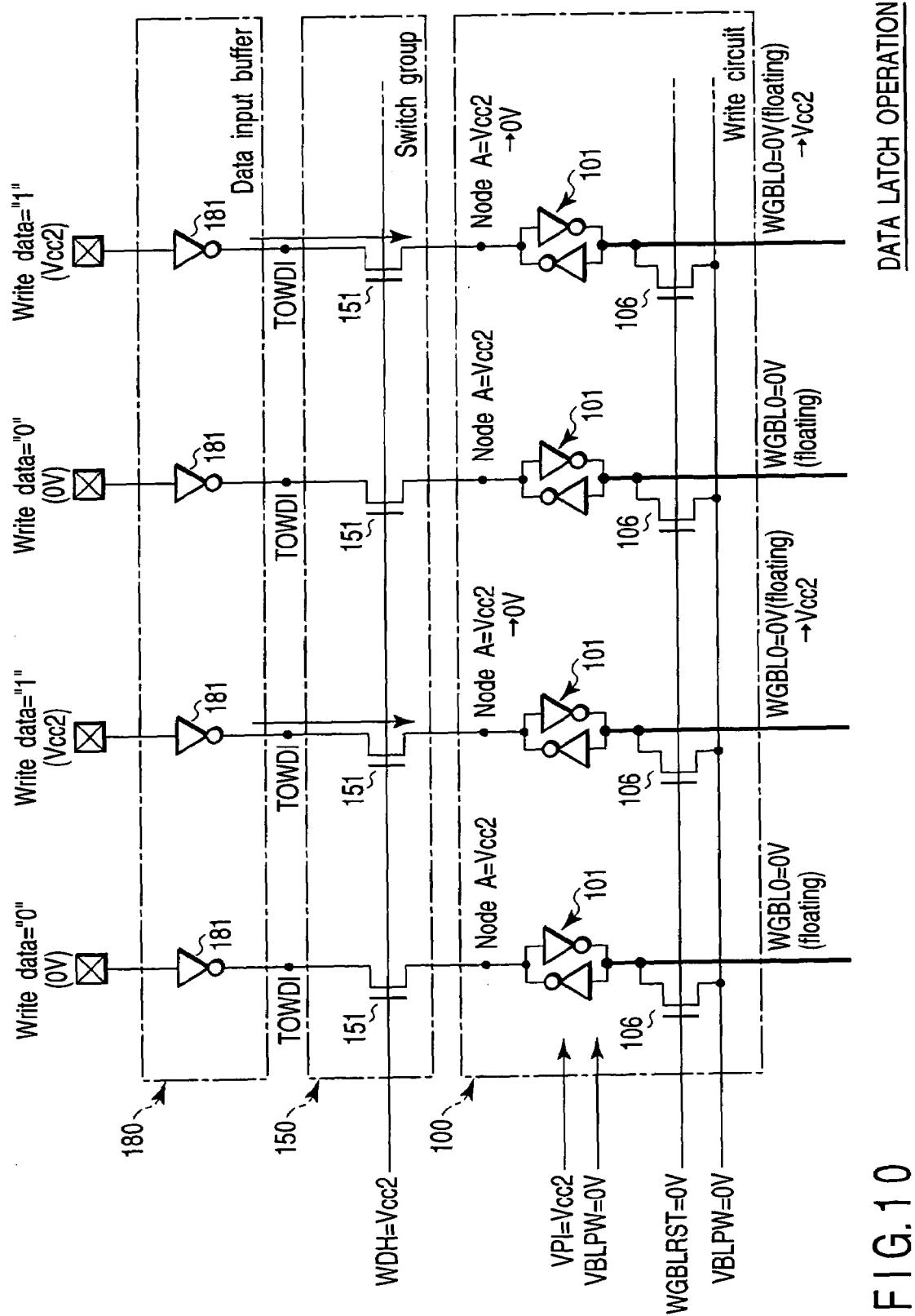
FIG. 10 is a circuit diagram of a part of the flash memory according to the first embodiment, which helps explain a data latch operation.

Next, to write data, the write circuit 100 latches write data. This operation will be explained using FIGS. 7 and 8 and FIG. 10. FIG. 10 is a circuit diagram to help explain the write circuit 100, switch group 150, and data input buffer 180 in a data latch operation.

First, to latch the input data, the selector control circuit 80 makes write inhibit column select lines ICSL0, ICSL1 and write column select lines WCSL0, WCSL1 unselected. Accordingly, local bit lines LBL0 to LBL3 are electrically isolated from the write inhibit voltage generator 140 and write global bit lines WGBL0 to WGBL(((n+1)/2)–1). The column decoder 90 makes all of read column select lines RCSL0 to RCSL3 unselected. As a result, local bit lines LBL1 to LBL3 are electrically isolated from read global bit lines RGBL0 to RGBL(((n+1)/4)–1).

Then, 0V is applied to the WGBLRST node, which turns off the reset transistor 101 in the write circuit 100 (step S20). Since the write global bit lines are at 0V in the preceding read operation, the potentials on all of write global bit lines (((n+1)/2)–1) are floating at 0V (step S21).

Next, Vcc2 and 0V are applied to the VPI node and VBLPW node, respectively (step S22). That is, the inverters 102, 103 in the latch circuit 101 operate using Vcc2 as the high-voltage-side power supply voltage and 0V as the low-voltage-side power supply voltage. Step S22 may be carried out in the read operation.

Therefore, since 0V is applied to the write global bit lines in the preceding write operation the potential at the input node (node A) of the latch circuit 101 is Vcc2. The potential at the output node (write global bit line) is, of course, 0V.

Next, write data is externally input to the data input buffer 180 (step S23). As shown in FIG. 10, when "0" data is input, 0V is applied to the input node of the inverter 181. When "1" data is input, Vcc2 is applied to the input node of the inverter 181. Therefore, the TOWDI node corresponding to the inverter 181 to which "0" data has been input goes to Vcc2. The TOWDI node corresponding to the inverter 181 to which "1" data has been input goes to 0V.

Then, Vcc2 is applied to the WDH node (step S24). Then, the MOS transistor 151 connected to the TOWDI node whose potential is at 0V is turned on, with the result that the potential at the TOWDI node is transferred to the input node (node A) of the latch circuit 101. On the other hand, since the MOS transistor 151 connected to the TOWDI node whose potential is at Vcc2 is cut off, with the result that the potential at the TOWDI node is not transferred to the latch circuit 101.

Specifically, when the write data is "1" data (step s25), the TOWDI node goes to 0V and the MOS transistor 151 is turned on, with the result that the latch circuit 101 takes in the write data (0V) from the TOWDI node side (step S26). As a result, the potential at the output node of the latch circuit 101 changes from 0V to Vcc2.

On the other hand, when the write data is "0" data (step S25), the MOS transistor 151 is off. Accordingly, the data held in the latch circuit 101 remains unchanged. In other words, the latch circuit 101 takes in the write data from the write global bit line (step S26). As a result, the potential at the input node (node A) of the latch circuit 101 changes to Vcc2.

As described above, the write data is latched in each of the latch circuits 101. As a result, the output voltages of the latch circuits 101 holding "1" data are at Vcc2. The output voltages of the latch circuits 101 holding "0" data are at 0V.

<Write Operation>

Next, a write operation is carried out according to the write data held in the latch circuit 101. Data is written simultaneously into a plurality of memory cells connected to any one of the word lines. Either "0" data or "1" data is written, depending on whether electrons are injected into the floating gate of a memory cell transistor MT. Electrons are injected into the floating gate by Fowler-Nordheim (FN) tunneling. More specifically, of the memory cells connected to any one of the word lines, data is written simultaneously into the memory cells connected to one of local bit lines LBL0 and LBL1 and into the memory cells connected to one of local bit lines LBL2 and LBL3.

Figure 11:
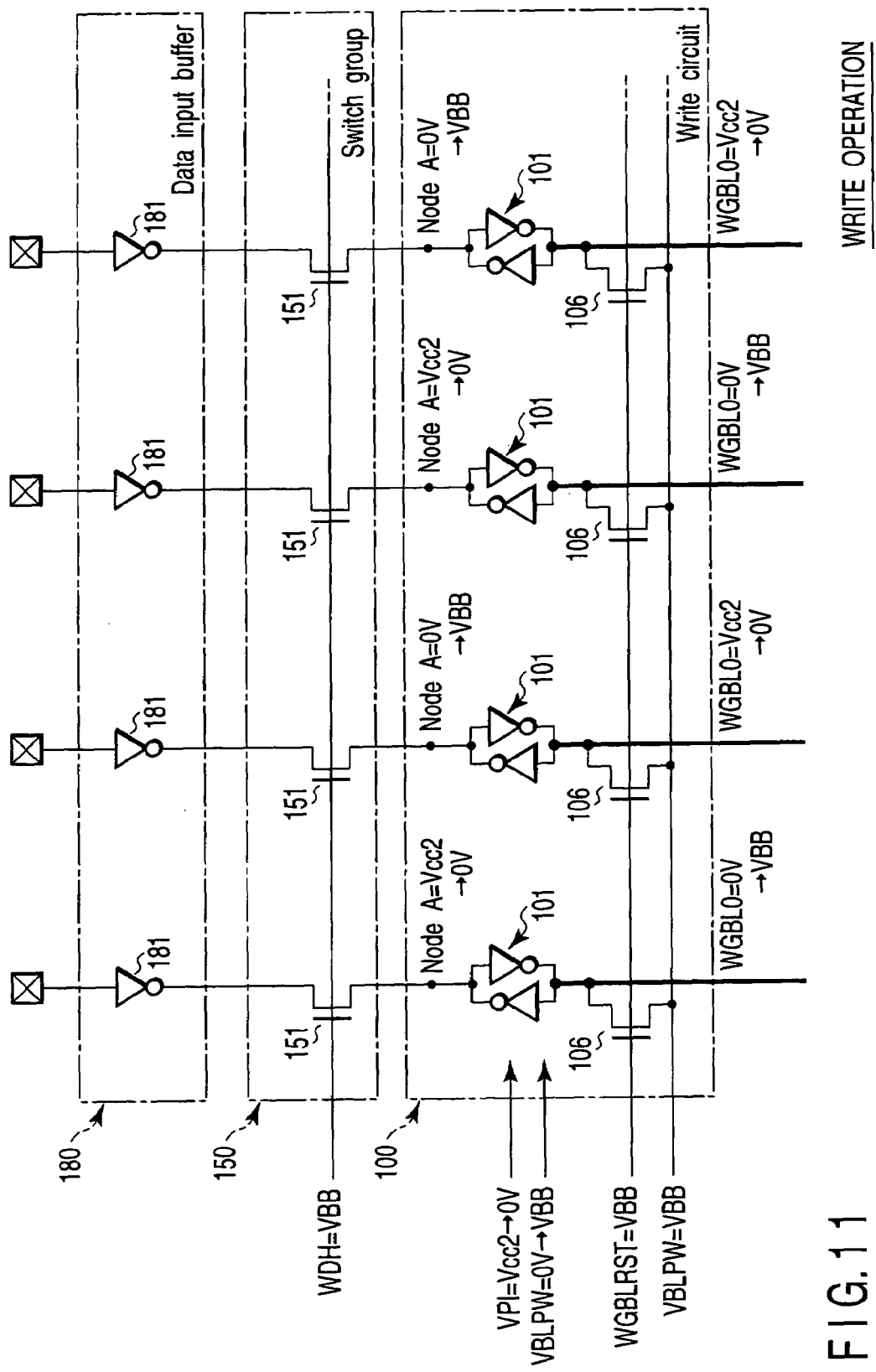
FIG. 11 is a circuit diagram of a part of the flash memory according to the first embodiment, which helps explain a write operation.
Figure 12:
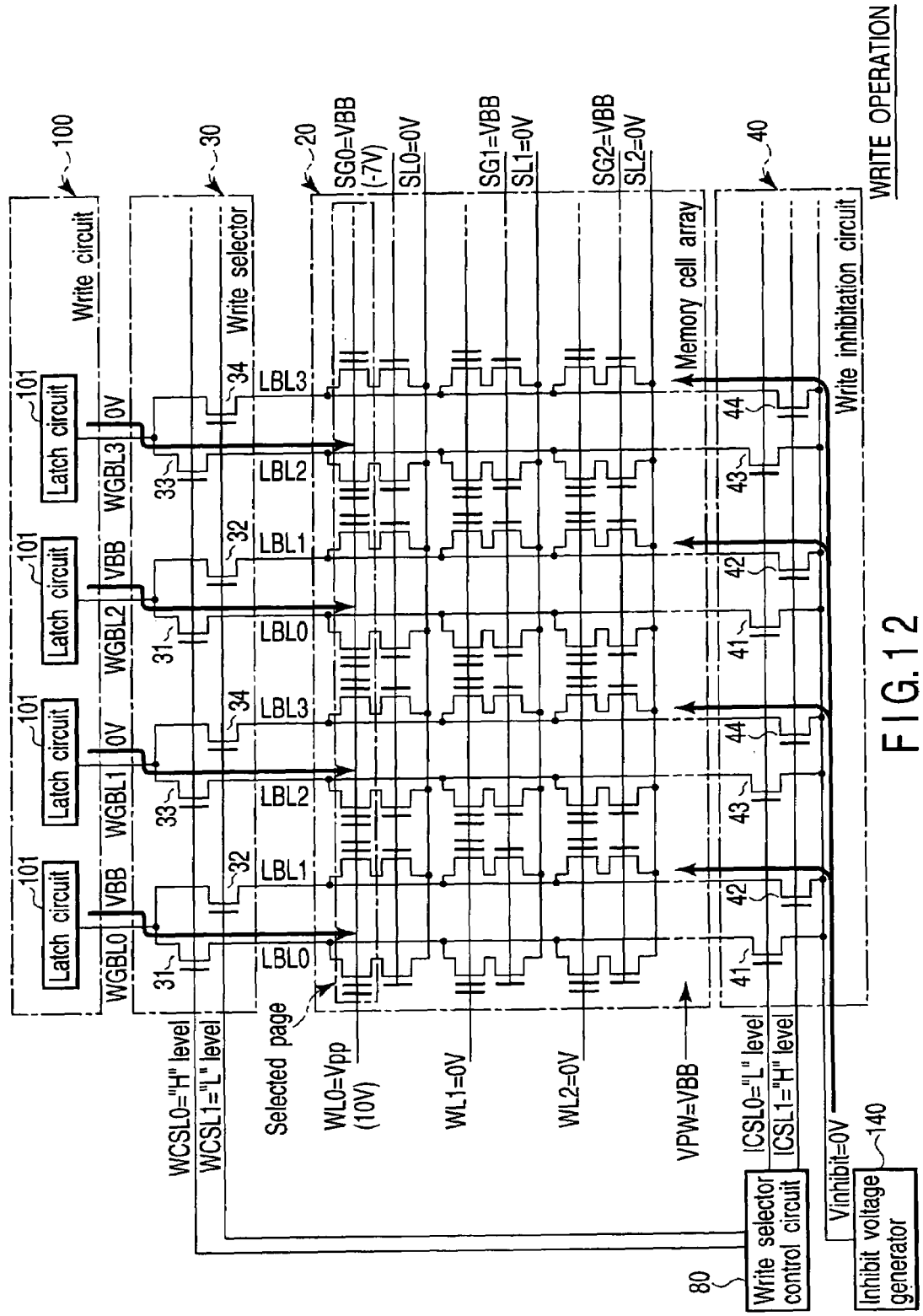
FIG. 12 is a circuit diagram of a part of the flash memory according to the first embodiment, which helps explain a write operation.

Hereinafter, using FIGS. 7 and 8 and FIGS. 11 and 12, a case where data is written into the memory cells MC connected to word line WL0 and local bit lines LBL0, LBL2 will be explained. FIG. 11 is a circuit diagram to help explain the write circuit 100, switch group 150, and data input buffer 180 in a data latch operation. FIG. 12 is a circuit diagram of the memory cell array.

First, to carry out a write operation, VBB is applied to the WDH node and WGBLRST node. Thus, the MOS transistor 151 is turned off, which separates the data input buffer 180 electrically form the write circuit 100. The MOS transistor 106 in the write circuit 100 still remains off.

Figure 3:
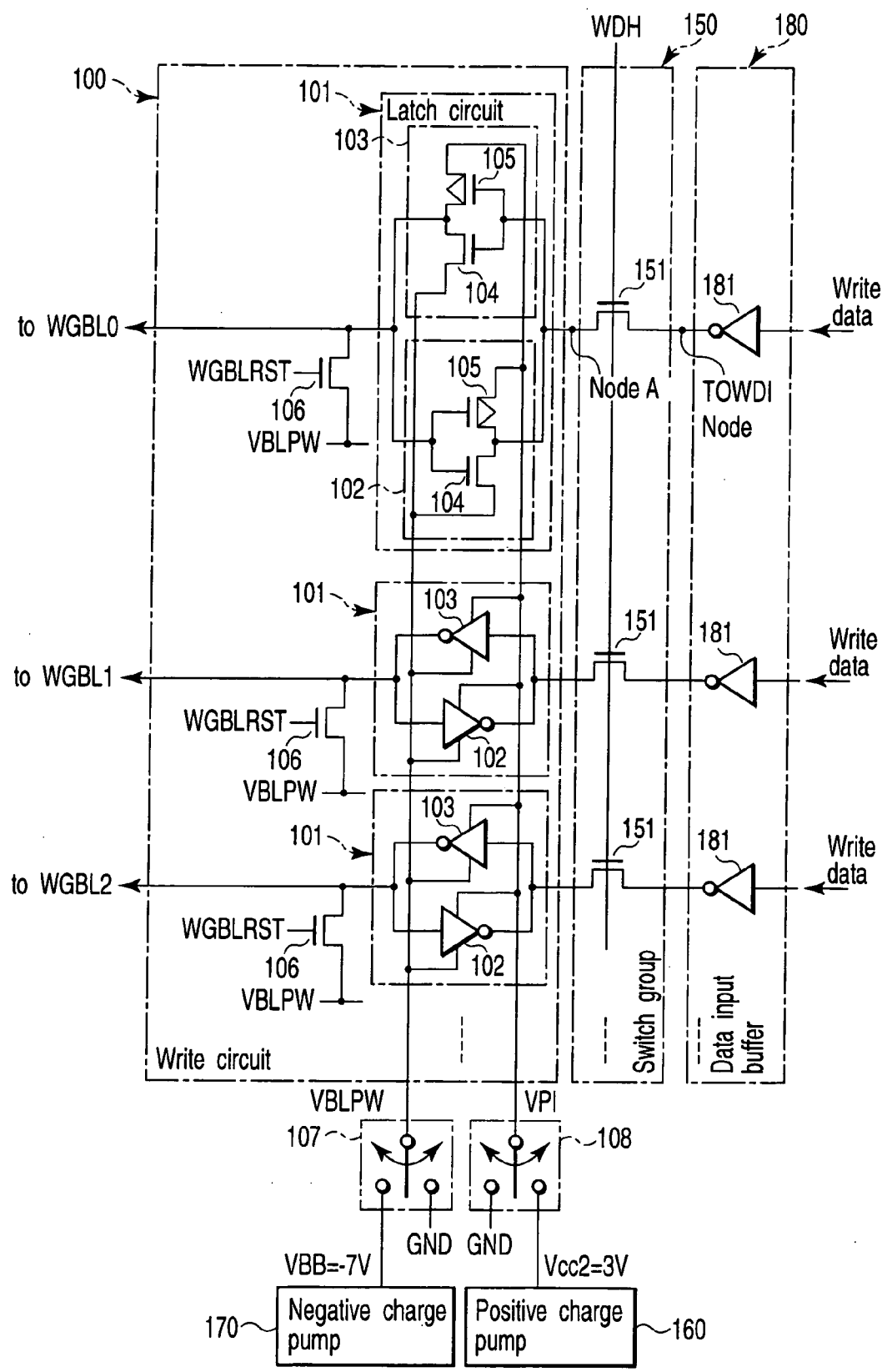
FIG. 3 is a circuit diagram of a write circuit, a switch group, and a data input buffer included in the flash memory of the first embodiment.

Then, the potential at the VPI node changes from Vcc2 to 0V and the potential at the VBLPW node changes from 0V to VBB (see FIG. 3). As a result, the output of the latch circuit 101 holding "1" data changes from Vcc2 to 0V. The output of the latch circuit 101 holding "0" data changes from 0V to VBB. These voltages are applied to the corresponding global bit lines WGBL.

As shown in FIG. 12, the write inhibit voltage generator 140 outputs the write inhibit voltage Vinhibit (0V) (step S31). As a result, 0V is applied to the sources of the MOS transistors 41 to 44 in the write inhibit selector 40.

Next, the selector control circuit 80 turns on the MOS transistors connected to the local bit lines to be made unselected in the write inhibit selector 40 (step S32). That is, the selector control circuit 80 selects write inhibit column select line ICSL1 and makes write inhibit column select line ICSL0 unselected. Accordingly, "L" (low) level (0V) is applied to write inhibit column select line ICSL0 and "H" (high) level (Vcc2=3V) is applied to write inhibit column select line ICSL1. As a result, the MOS transistors 42, 44 are turned on and the MOS transistors 41, 43 are turned off. Therefore, the write inhibit voltage Vinhibit supplied from the write inhibit voltage generator 140 is applied to local bit lines LBL1, LBL3 to be made unselected.

Moreover, the selector control circuit 80 turns on the MOS transistors connected to the local bit lines to be selected in the write selector 30 (step S33). Specifically, the selector control circuit 80 selects write column select line WCSL0 and makes write column select line WCSL1 unselected. Accordingly, a "H" (high) level (Vcc2=3V) is applied to write column select line WCSL0 and a "L" (low) level (0V) is applied to write column select line WCSL1. As a result, the MOS transistors 31, 33 are turned on and the MOS transistors 32, 34 are turned off. Therefore, the latch circuit 101 applies a voltage corresponding to the write data (0V or VBB) to local bit lines LBL0, LBL1 to be selected.

Then, on the basis of the row address signal input from the address buffer 130, the write decoder 60 selects any one of word lines WL0 to WLm (step S34). In the example of FIG. 8, the write decoder 60 selects word line WL0. Then, the write decoder 60 applies VPP (e.g., 10V) to the selected word line WL0. In addition, the write decoder 60 makes all of select gate lines SG0 to SGm unselected (step S35). That is, the write decoder 60 applies the negative voltage VBB to all of select gate lines SG0 to SGm. As a result, all of the select transistors ST are turned off. At this time, select gate lines SG0 to SGm are electrically isolated from the select gate decoder 70.

Furthermore, the write decoder 60 applies the negative voltage VBB to the p-well region 220 in which the memory cell array 20 has been formed (step S36).

As a result, a voltage corresponding to "1" data or "0" data is applied from the write global bit lines via the MOS transistors 31, 33 in the write selector 30 to local bit lines LBL0, LBL2 to which the selected memory cell is connected. The potential is supplied via the contact plug CP2 to the drain region of the memory cell transistor MT. Then, Vpp (10V) is applied to the selected word line WL, 0V is applied to the drain region of the memory cell MC into which "1" data is to be written, and VBB (−7V) is applied to the drain region of the memory cell MC into which "0" data is to be written. Therefore, since the potential difference (10V) between the gate and drain of the memory cell MC into which "1" data is to be written is insufficient, no electrons are injected into the floating gate, with the result that the memory cell MC keeps the negative threshold value. On the other hand, since the potential difference between the gate and drain of the memory cell MC into which "0" data is to be written is large (17V), electrons are injected into the floating gate by FN tunneling, with the result that the threshold value f the memory cell MC changes to positive (step S37).

Furthermore, the write inhibit voltage generator 140 supplies the write inhibit voltage Vinhibit via the MOS transistors 42, 44 of the write inhibit selector 40 to local bit lines LBL1, LBL3 to which the selected memory cell is not connected. As a result, the memory cells connected to local bit lines LBL1, LBL3 are prevented from being written into erroneously.

As described above, the memory cells are written into.

In the write operation, read column select lines RCSL0 to RCSL3 are made unselected and all of the MOS transistors 51 to 54 in the read selector 50 are turned off. Therefore, local bit lines LBL0 to LBL3 are electrically isolated from the read global bit lines RGBL.

<Erase Operation>

Figure 13:
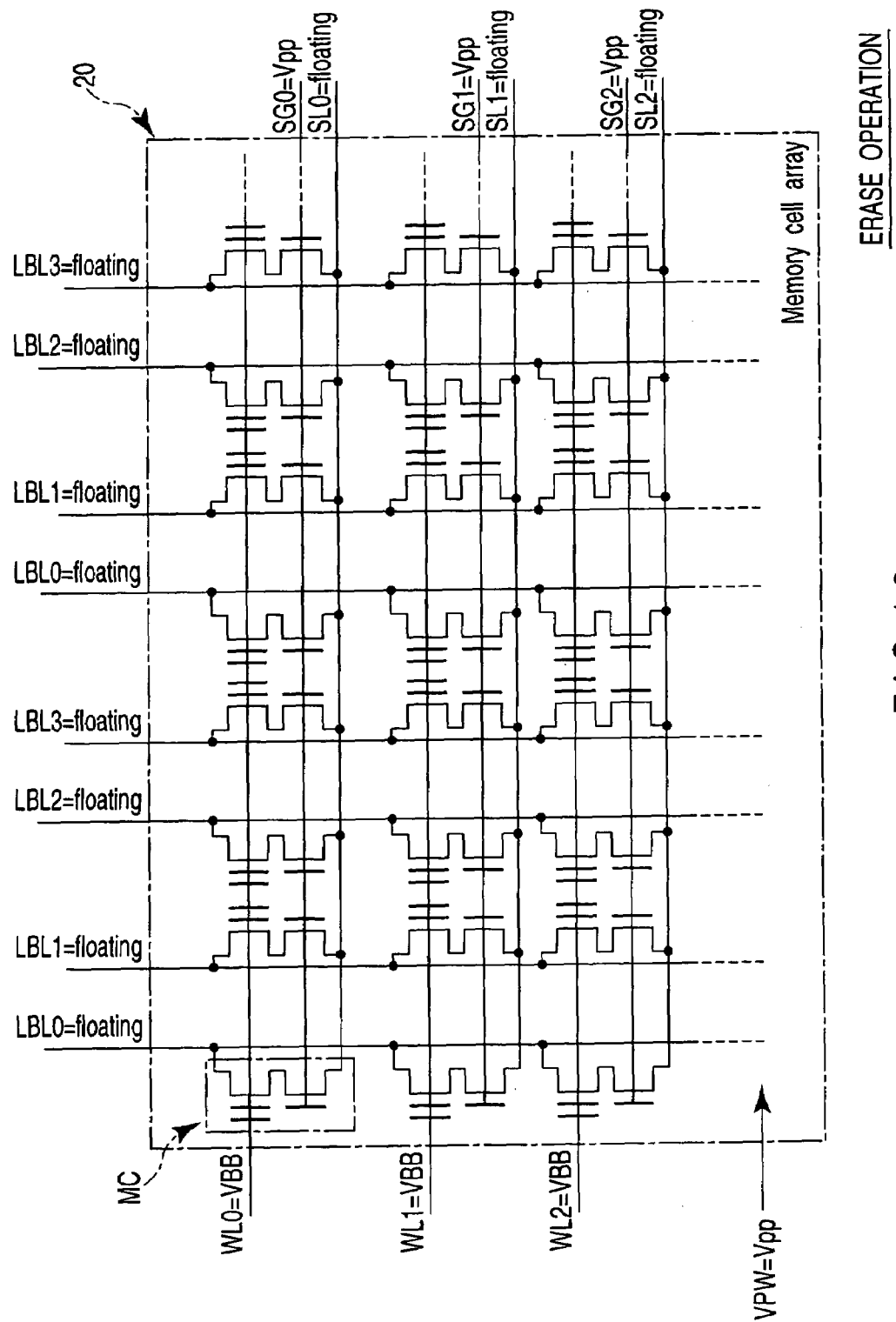
FIG. 13 is a circuit diagram of a part of the flash memory according to the first embodiment, which helps explain an erase operation.

The data in all of the memory cells sharing a well region is erased at the same time. Therefore, in the example of FIG. 2, all the memory cells included in the memory cell array 20 are erased from simultaneously. FIG. 13 is a circuit diagram of the memory cell array 20 in an erase operation.

To carry out an erase operation, the MOS transistors 31 to 34 in the write selector 30, the write inhibit selector 41 to 44, and the MOS transistors 51 to 54 in the read selector 60 are turned off. As a result, all of local bit lines LBL0 to LBL3 in the memory cell array 20 are made floating.

Then, the write decoder 60 places all of word lines WL0 to WLm at VBB. The potential in the well region 220 is made VPP. As a result, electrons are pulled out of the floating gates of the memory cell transistors in the memory cells MC by FN tunneling into the well region 220. As a result, the threshold voltages of all of the memory cells MC become negative, thereby erasing the data.

Select gate lines SG0 to SGm are made floating. Alternatively, the write decoder applies VPP to select gate lines SG0 to SGm. When they are made floating, their potentials rise to almost VPP as a result of coupling with the well region.

As described above, the flash memory according to the first embodiment produces the following effects.

(1) The flash memory can be made smaller

With configuration of the first embodiment, the switch group 150 which transfers the input data from the data input buffer 180 to the write circuit 100 includes only n-channel MOS transistors 151. Therefore, the size of the switch group can be made smaller than when the switch group includes p-channel MOS transistors or when it includes a combination of n-channel MOS transistors and p-channel MOS transistors. Consequently, the flash memory can be made smaller.

(2) The read operation reliability can be improved

With the configuration of the first embodiment, in a read operation, the reset transistor 106 causes the potentials on the write global bit lines to go to 0V. This reduces noise on the read global bit lines caused by the write global bit lines, when the write global bit lines are close to the read global bit lines. As a result, the read operation reliability can be improved.

(3) The write operation reliability can be improved

With the configuration of the first embodiment, before write data is latched, the potentials on the write global bit lines are set at 0V. This enables the latch circuit 101 to take in "0" data from the write global bit lines.

As explained in item (1), the switch group 150 is includes n-channel MOS transistors. Generally, when "0" data is externally input, the data is input by applying 0V. Then, 0V externally input as "0" data is inverted by the inverter 181 into about Vcc2. This may permit the MOS transistors 151 in the switch group 150 to be cut off. That is, the externally input "0" data may not be transferred to the latch circuit 101.

However, with the first embodiment, before a data latch operation, the reset transistor 106 causes the write global bit lines to go to 0V. Therefore, by taking in 0V from the write global bit lines, the latch circuits 101 can produce the same effect as taking in "0" data externally input. Consequently, the reliability of "0" data writing can be improved.

Furthermore, with the flash memory of the first embodiment, in a write operation, the write inhibit voltage Vinhibit supplied from the write inhibit voltage generator 140 is supplied to the local bit lines to which the selected memory cell is not connected. Accordingly, the unselected memory cells can be prevented from being written into erroneously.

In addition, the bit lines are hierarchized into the local bit lines and the global bit lines. A plurality of local bit lines are connected to a single write global bit line. In a write operation, only one local bit line including the selected memory cell is connected electrically to the write global bit line and the other local bit lines are electrically isolated from the write global bit line. Thus, the voltages corresponding to the write data from the latch circuits are not applied to the local bit lines to which the selected memory cell is not connected. Accordingly, the memory cells connected to these local bit lines can be prevented effectively from being written into erroneously. As a result, the write operation reliability can be improved.

Figure 14:
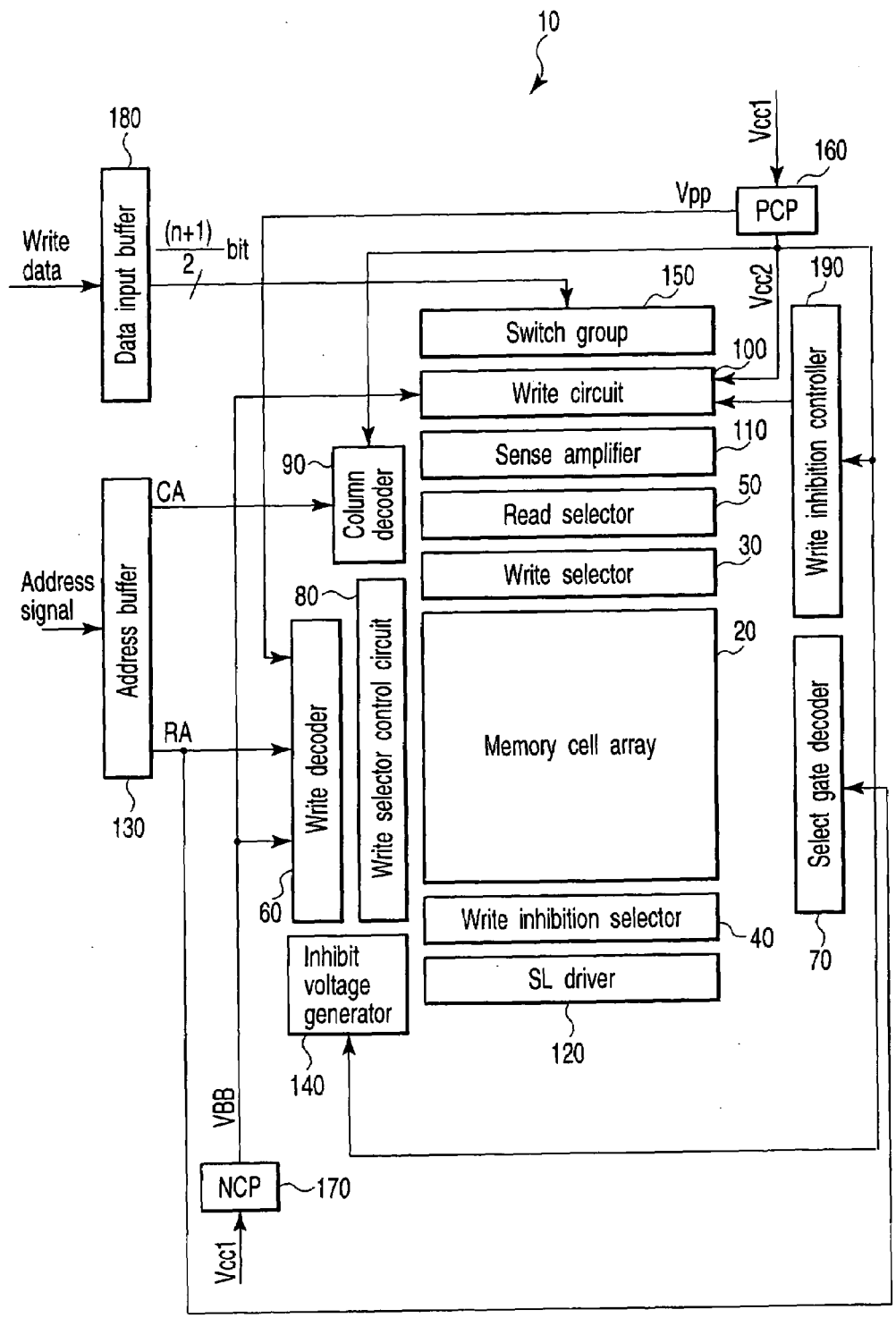
FIG. 14 is a block diagram of a flash memory according to a second embodiment of the present invention.

Next, a semiconductor memory device according to a second embodiment of the present invention and a method of controlling the semiconductor memory device will be explained. The second embodiment is such that the number of bits in input data is smaller than the number of write global bit lines in the memory cell array in the first embodiment. FIG. 14 is a block diagram of a flash memory according to the second embodiment.

As shown in FIG. 14, the flash memory 10 of the second embodiment is such that a write inhibit control circuit 190 is further provided in the configuration of FIG. 1 in the first embodiment. The write inhibit control circuit 190 causes the latch circuits 101 to which no data is input to hold "1" data in a data latch operation before writing is done. Since the remaining configuration is the same as that of the first embodiment, explanation will be omitted.

Figure 15:
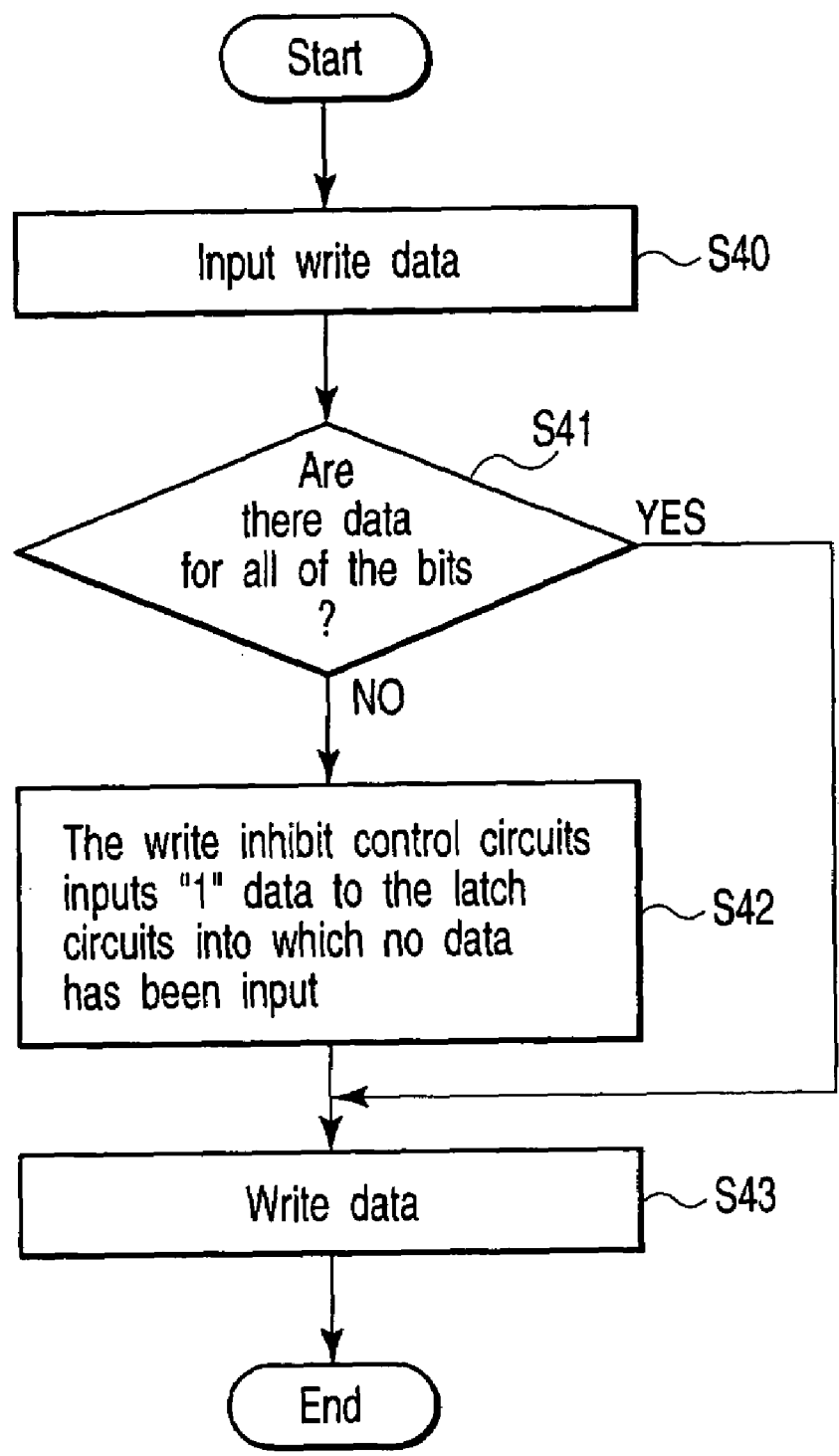
FIG. 15 is a flowchart for a data latch operation in the flash memory of the second embodiment.
Figure 16:
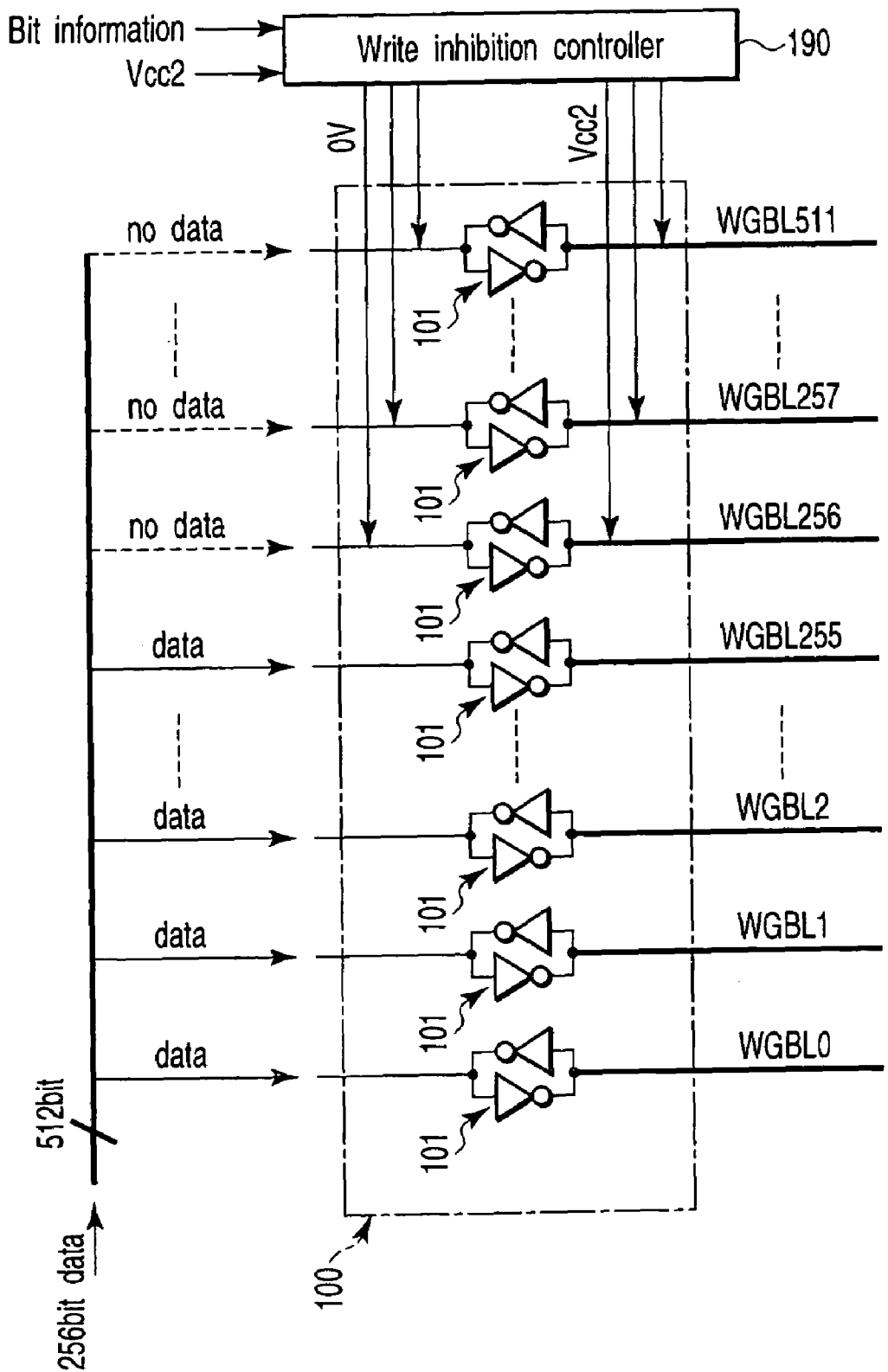
FIG. 16 is a circuit diagram of a part of the flash memory according to the second embodiment, which helps explain a data latch operation.

Next, a data latch operation in the flash memory of the second embodiment will be explained using FIGS. 15 and 16. FIG. 15 is a flowchart for a data latch operation. FIG. 16 is a circuit diagram to help explain the write circuit 100 and write inhibit control circuit 190 in a data latch operation.

First, after step S20 to step S22 explained in FIG. 7, write data is input (step S40). Here, as shown in FIG. 16, it is assumed that the number of write global bit lines is 512. If the externally input data are for 512 lines, that is, if the externally input data contain 512 bits (step S41), the latch circuits 101 latch the data allocated to the respective latch circuits by the processes in step S24 to step S27. On the other hand, if the externally input data contains less than 512 bits (step S41), the write inhibit control circuit 190 inputs "1" data to the latch circuits 101 to which no data is input (step S42). The process in step S42 will be explained using FIG. 16.

As shown in FIG. 16, it is assumed that, although there are 512 write global bit lines, only the data corresponding to write global bit lines WGBL0 to WGBL255 (256 bits) are externally input. In this case, no data may be input to the latch circuits corresponding to write global bit lines WGBL256 to WGBL511.

When write data is input, the initial values on all of write global bit lines WGBL0 to WGBL511 are made 0V. In other words, all of the latch circuits 101 hold "0" data as the initial value. Therefore, if no data is input to the latch circuits 101 in a data latch operation, "0" data can be written into the memory cells connected to write global bit lines WGBL256 to WGBL511 corresponding to the latch circuits 101.

To overcome this problem, the write inhibit control circuit 190 causes the latch circuits 101 corresponding to write global bit lines WGBL256 to WGBL511 to hold "1" data on the basis of the number of bits in the input write data. More specifically, the write inhibit control circuit 190 applies 0V to the input nodes of the latch circuits 101 or Vcc2 to the output nodes of the latch circuits 101.

As described above, after all of the latch circuits 101 are caused to hold write data, data is written into the memory cells by the method explained in the first embodiment (step S43).

Since a write operation and a read operations are the same as those in the first embodiment, explanation will be omitted.

As described above, the configuration and method of the second embodiment produce not only the effects in items (1) to (3) explained in the first embodiment but also the following effect in item (4).

(4) The write operation reliability can be improved further.

In a case where no data has been set in a latch circuit, when the data held in the latch circuit has changed to "0" data for some reason, electrons are injected into the floating gate of the memory cell corresponding to the latch circuit.

However, with the configuration of the second embodiment, the write inhibit control circuit 190 forces the latch circuit in which no write data has been set to hold "1" data. Then, "1" data is written into the memory cell connected to write global bit line corresponding to the latch circuit and the selected word line. When "1" data is written, no electron is injected into the floating gate of the memory cell and the threshold voltage of the memory cell transistor remains unchanged. That is, the memory cell continues holding the present data. Therefore, the memory cell is prevented from being written into erroneously, which improves the write operation reliability further.

Figure 17:
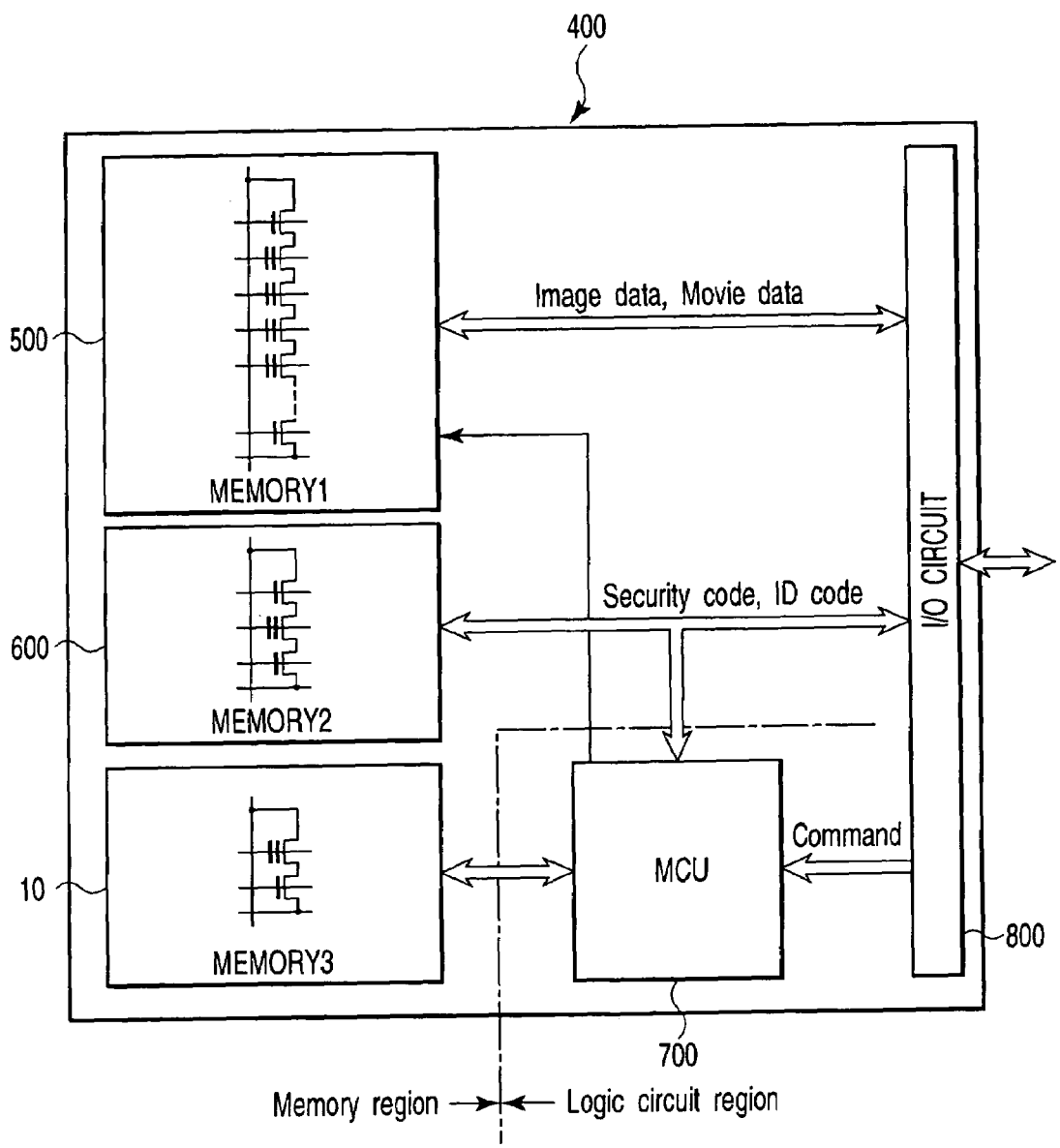
FIG. 17 is a block diagram of an LSI including a flash memory according to a third embodiment of the present invention.

Next, a semiconductor memory device according to a third embodiment of the present invention will be explained. The third embodiment relates to a system LSI including flash memories according to the first and second embodiments. FIG. 17 is a block diagram of a system LSI according to the third embodiment.

As shown in FIG. 17, a system LSI 400 comprises a NAND flash memory 500, a 3Tr-NAND flash memory 600, a 2Tr flash memory 10, an MCU 700, and an I/O circuit 800, which are formed on a single semiconductor substrate.

The NAND flash memory 500 is used as a storage memory for storing image data or video data.

The 3Tr-NAND flash memory 600 holds an ID code for accessing the LSI 400 and a security code.

The 2Tr flash memory 10 holds program data for the MCU 700 to operate.

The MCU 700 does processing on the basis of the program read from the 2Tr flash memory 10, in response to various commands externally input. At this time, the MCU 700 accesses the 2Tr flash memory 10 directly without intervention of an SRAM (Static Random Access Memory) or the like. The processing done by the MCU 700 includes the compression or decompression of the data input to the NAND flash memory 500 and control of an external device. In addition, the MCU 700 reads specific data from the 3Tr-NAND flash memory 600, when the data held in the NAND flash memory 500 is accessed from the outside.

Then, the MCU 700 checks the read-out data against the externally input ID code or security code. If they coincide with each other, the MCU 700 permits access to the NAND flash memory 500. When access to the NAND flash memory 500 is permitted, the data in the NAND flash memory 500 is accessed from the outside (host). Specifically, the MCU 700 triggers the NAND flash memory 500 in response to the command received from the outside, thereby reading (writing) the data.

The I/O circuit 800 controls the exchange of signals between the LSI 400 and the outside.

Next, the configuration of two semiconductor memories 500, 600 included in the LSI 400 will be explained in detail. The 2Tr flash memory 10 is as explained in the first and second embodiments.

<NAND Flash Memory>

Figure 18:
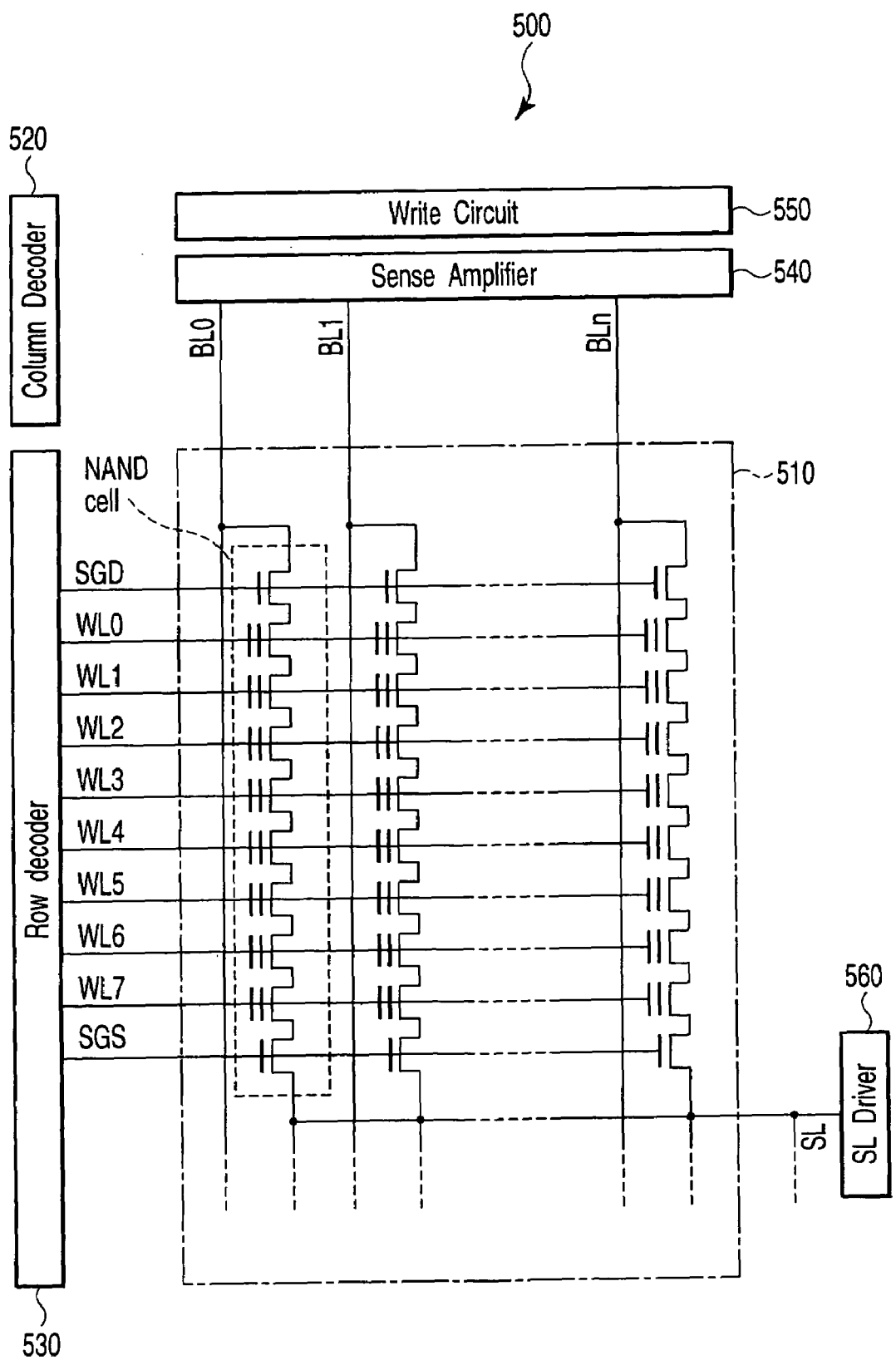
FIG. 18 is a block diagram of a NAND flash memory.

First, the configuration of the NAND flash memory 500 will be explained using FIG. 18. FIG. 18 is a block diagram of the NAND flash memory.

As shown in FIG. 18, the NAND flash memory 500 comprises a memory cell array 510, a column decoder 520, a row decoder 530, a sense amplifier 540, a write circuit 550, and a source line driver 560.

The memory cell array 510 has a plurality of NAND cells arranged in a matrix. Each of the NAND cells includes eight memory cell transistors MT and select transistors ST1, ST2. A memory cell transistor MT has a stacked-gate structure that includes a floating gate formed above a semiconductor substrate via a gate insulating film and a control gate formed above the floating gate via an inter-gate insulating film. The number of memory cell transistors MT is not limited to 8 and may be 16 or 32. The number is illustrative and not restrictive. The adjoining ones of the memory cell transistors MT share their source and drain. They are arranged in such a manner that their current paths are connected in series between the select transistors ST1, ST2. The drain region at one end of the series connection of the memory cell transistors MT is connected to the source region of the select transistor ST1. The source region at the other end is connected to the drain region of the select transistor ST2.

The control gates of the memory cell transistors MT in a row are connected commonly to any one of word lines WL0 to WLm. The gates of the select transistors ST1, ST2 in the same row are connected to select gate lines SGD, SGS, respectively. The drains of the select transistors ST1 in a column are connected commonly to any one of bit lines BL0 to BLn. The sources of the select transistors ST2 are connected commonly to a source line SL and then connected to a source line driver 560. Both of the select transistors ST1, ST2 are not necessarily needed. Only one of them may be used, provided that it can select a NAND cell.

The column decoder 520 decodes a column address signal, thereby producing a column address decode signal. On the basis of the column address decode signal, any one of bit lines BL0 to BLn is selected.

The row decoder 530 decodes a row address signal, thereby producing a row address decode signal. Then, the row decoder 530 selects any one of word lines WL0 to WLm and any one of select gate lines SG0 to SGm.

The sense amplifier 540 amplifies the data read from the memory cell MC selected by the row decoder 530 and column decoder 520.

The write circuit 550 latches write data.

The source line driver 560 supplies a voltage to the source line SL.

<3Tr-NAND Flash Memory>

Figure 19:
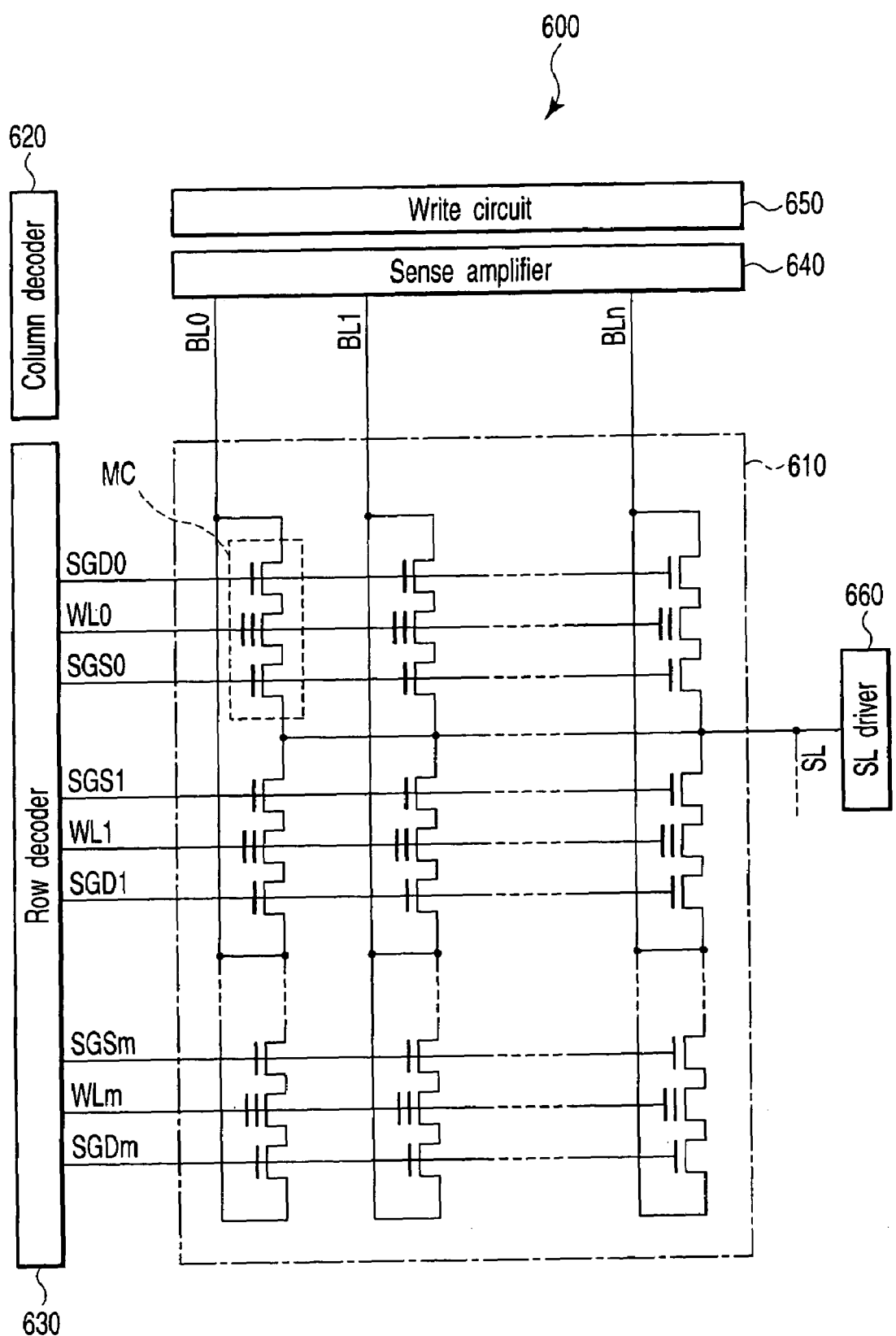
FIG. 19 is a block diagram of a 3Tr-NAND flash memory.

Next, the configuration of the 3Tr-NAND flash memory 600 will be explained using FIG. 19. FIG. 19 is a block diagram of the 3Tr-NAND flash memory 600.

As shown in FIG. 19, the 3Tr-NAND flash memory 600 comprises a memory cell array 610, a column decoder 620, a row decoder 630, a sense amplifier 640, a write circuit 650, a source line driver 660.

The memory cell array 610 has a plurality of ((m+1)×(n+1)) memory cells MC (m and n are natural numbers) arranged in a matrix. Each of the memory cells MC includes a memory cell transistor MT and select transistors ST1, ST2, which have their current paths connected in series with one another. The current path of the memory cell transistor MT is connected between the current paths of the select transistors ST1, ST2. This is equivalent to using a single memory cell transistor MT in a NAND cell included in the NAND flash memory 500. The memory cell transistor MT has a stacked gate structure that includes a floating gate formed above a semiconductor substrate via a gate insulating film and a control gate above the floating gate via an inter-gate insulating film. The source region of the select transistor ST1 is connected to the drain region of the memory cell transistor MT. The source region of the memory cell transistor MT is connected to the drain region of the select transistor ST2. Memory cells MC adjoining each other in the column direction share the drain region of the select transistor ST1 or the source region of the select transistor ST2.

The control gates of the memory cell transistors MT of the memory cells MC in a row are connected commonly to any one of word lines WL0 to WLm. The gates of the select transistors ST1 of the memory cells in a row are connected to any one of select gate lines SGD0 to SGDm. The gates of the select transistors ST2 are connected to any one of select gate lines SGS0 to SGSm. The drain regions of the select transistors ST1 of the memory cells MC in a column are connected commonly to any one of bit lines BL0 to BLn. The sources of the select transistors ST2 of the memory cells MC are connected commonly to a source line SL and then connected to the source line driver 260.

The column decoder 620 decodes a column address signal, thereby producing a column address decode signal. On the basis of the column address decode signal, any one of bit lines BL0 to BLn is selected.

The row decoder 630 decodes a row address signal, thereby producing a row address decode signal. Then, the row decoder 230 selects any one of word lines WL0 to WLm and any one of select gate lines SG0 to SGm.

The sense amplifier 640 amplifies the data read from the memory cell MC selected by the row decoder 630 and column decoder 620.

The write circuit 650 latches write data.

The source line driver 660 supplies a voltage to the source line SL.

The LSI of the third embodiment produces not only the effects in items (1) to (4) but also the following effect in item (5).

(5) It is possible to mount a plurality of types of flash memories on a single chip, while suppressing the manufacturing cost.

The memory cell transistors MT and select transistors ST1, ST2, ST included in the NAND flash memory 500, 3Tr-NAND flash memory 600, and 2Tr flash memory 10 are formed in the same processes. That is, the individual MOS transistors are formed in the same oxidizing process, film-forming process, impurity implanting process, and photolithographic etching process. As a result, the gate insulating film 240, inter-gate insulating film 260, the floating gates 250 and control gates 270 of the memory cell transistors MT, and the select gates 250, 270 of the select transistors are the same in the three flash memories 10, 500, 600. In such a manufacturing method, the memory cell arrays of the three flash memories can be formed by the number of processes required to form a single flash memory. Therefore, the manufacturing cost of a system LSI including three types of semiconductor memories can be reduced.

(6) The performance of the system LSI can be made higher

The system LSI of the third embodiment has not only the 2Tr flash memory 10 explained in the first and second embodiments but also the NAND flash memory 500 and 3Tr-NAND flash memory 600.

Unlike the NAND flash memory 500 and 3Tr-NAND flash memory 600, the 2Tr flash memory 10 uses a positive voltage (10V) and a negative voltage (−7V) in a write operation and an erase operation. Then, the 2Tr flash memory 10 applies a potential difference of 16V between the control gate and the channel. Therefore, the write inhibit voltage can be set to 0V near the midpoint between 0V and −7V, which makes it easy to apply the write inhibit voltage from the bit line. Because the positive and negative voltages are used, the potential difference applied to the gate insulating films of the MOS transistors used in the decoders 60, 70 is 10V or −7V. Therefore, the gate insulating films of the MOS transistors used in the row decoders 60, 70 included in the 2Tr flash memory 10 may be thinner than those of the MOS transistors used in the row decoders 530, 630 included in the NAND flash memory 500 and 3Tr-NAND flash memory 600. Therefore, the decoders 60, 70 of the 2Tr flash memory 10 can be made more compact. In addition, the operating speed of the decoders 60, 70 can be made higher than that of the row decoders 530, 630. Accordingly, the operating speed of the 2Tr flash memory can be improved and the random access can be made faster.

In the third embodiment, the program data for the MCU 700 to operate is stored in the 2Tr flash memory 10. Thus, the 2Tr flash memory can operate at high speed as described above. Thus, the MCU 700 can read the data directly from the 2Tr flash memory 10 without RAM or the like. As a result, a RAM or the like is not needed, which helps simplify the configuration of the system LSI and improve the operating speed.

In addition, the 3Tr-NAND flash memory 600 holds an ID code and a security code. These code data are not so large in the amount of data, but are frequently changed and updated. Thus, the memory to hold the code data is required to operate at high speed. In this respect, the 3Tr-NAND flash memory 600 has a smaller erase unit than that of the NAND flash memory 100 and can rewrite the data in pages. Therefore, it can be said that the 3Tr-NAND flash memory 600 is the best semiconductor memory to hold the code data.

A conventional LSI including a NAND flash memory requires the following controller to prevent rewriting from concentrating on a specific block. The controller converts addresses input in ware leveling or logic form into physical addresses or, when a block malfunctions, determines the block to be faulty and performs control to prevent the faulty block from being used. In the third embodiment, however, such a controller is not needed. The reason is that the 2Tr flash memory 10 is caused to hold a firmware program to control the blocks in the NAND flash memory 500 and the MCU 700 is caused to perform such control. The MCU 700 performs the control in an interval of time between its original jobs (such as the process of controlling an external device or the process of computing the data input to the NAND flash memory 500). Of course, when the comparison of the capacity of the MCU 700 with the amount of work the MCU 700 has to process has shown that the amount of work has exceeded the capacity, a hardware sequencer or the like may be provided to control the NAND flash memory 500.

As described above, according to the nonvolatile semiconductor memory device and its control method according to the first to third embodiments, the switch group 150 for transferring the externally input write data to the write circuit can be made from only n-channel MOS transistors and therefore p-channel MOS transistors are unnecessary. Therefore, the size of the switch group 150 can be made smaller, which enables the flash memory to be made smaller.

Moreover, use of the reset transistor 106 enables the latch circuits 101 to hold "0" data.

Figure 20:
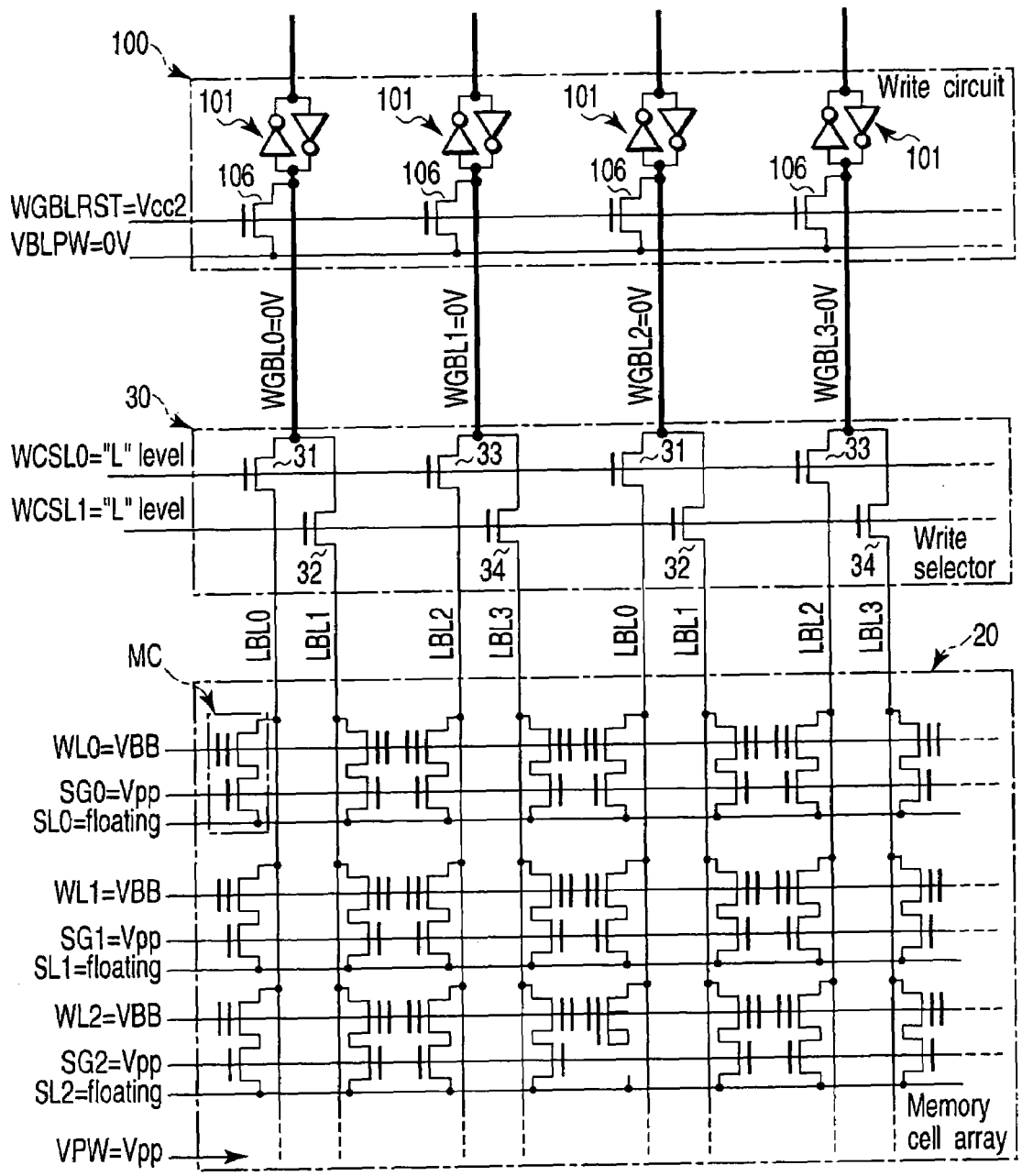
FIG. 20 is a circuit diagram of a part of a flash memory according to a first modification of each of the first to third embodiments.

Here, as the reset transistor 106, for example, the MOS transistor for fixing the potential on the write global bit lines in an erase operation can also be used. As shown in FIG. 20, it is desirable that the potential on the write global bit lines should be kept at 0V in an erase operation. The reason for this is to prevent pass-through current from flowing from the write global bit lines to the local bit lines. The MOS transistor 106 used for such a purpose can also be used as the MOS transistor 106.

Figure 21:
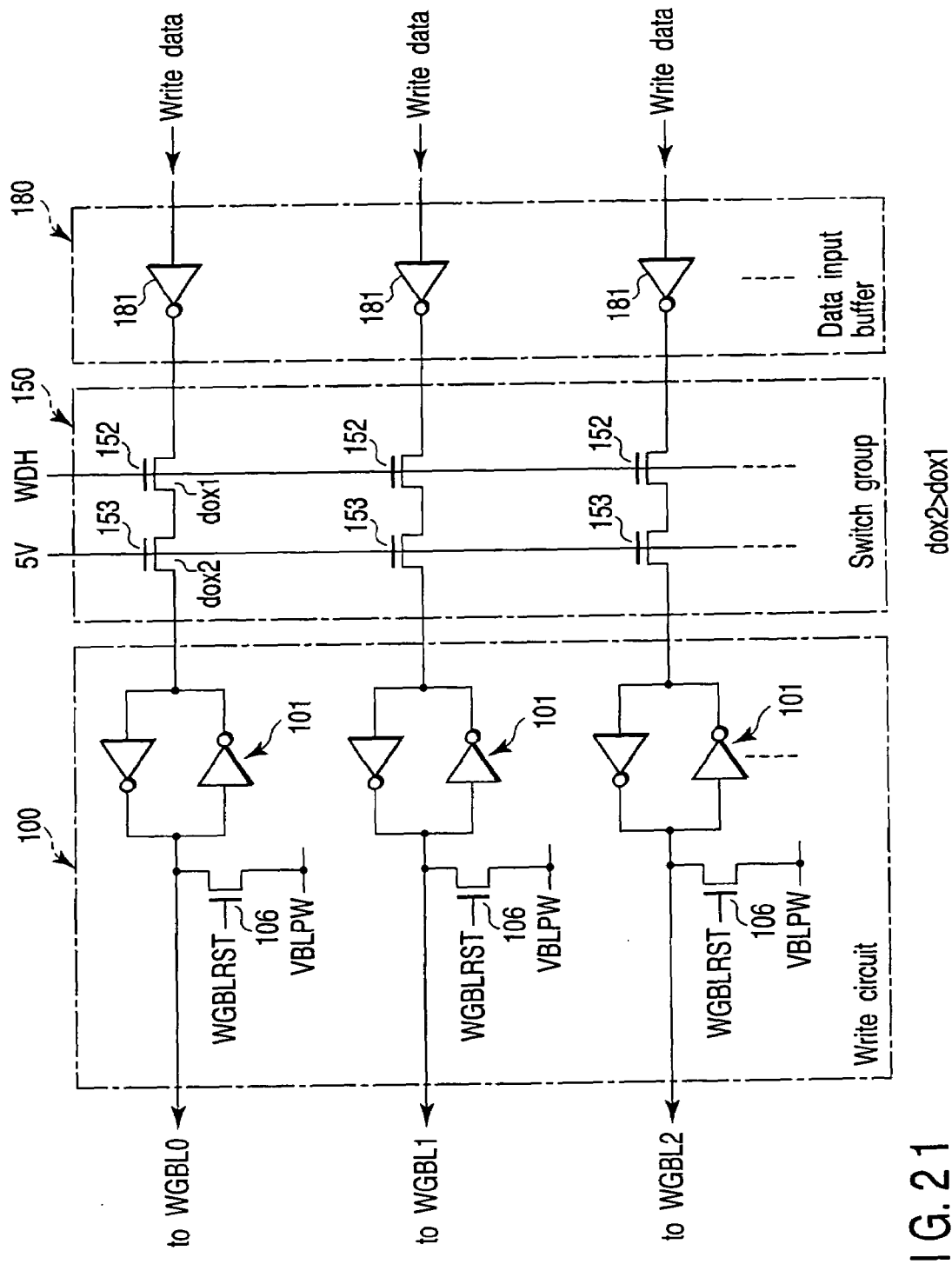
FIG. 21 is a circuit diagram of a part of a flash memory according to a second modification of each of the first to third embodiments.

In the first to third embodiments, each of the n-channel MOS transistors 151 in the switch group 150 may be replaced with two n-channel MOS transistors. FIG. 21 is a circuit diagram of the write circuit 100, switch group 150, and data input buffer 180.

As shown in FIG. 21, the MOS transistor 151 is replaced with two MOS transistors 152, 153 connected in series. The MOS transistor 153 is connected to the latch circuit 101 and the MOS transistor 152 is connected to the inverter 181. The MOS transistor 152 is a low-withstand-voltage MOS transistor whose gate insulating film dox1 is thin. The MOS transistor 153 is a high-withstand-voltage MOS transistor whose gate insulating film dox2 (dox2>dox1) is thicker than that of the MOS transistor 152. The boosting circuit 160 always applies, for example, 5V to the gate of the MOS transistor 153 in a data latch operation. That is, the MOS transistor 153 does not carry out a switching operation. On the other hand, the gate of the MOS transistor 152 is connected to the WDH node. On the basis of the potential at the WHD node, the MOS transistor 152 performs a switching operation. During the period excluding the data latch operation, the MOS transistor 153 is kept off. Therefore, the negative potential VBB is not applied to the MOS transistor 152.

With this configuration, the high-withstand-voltage MOS transistor 153 does not practically function as a switch element. The low-withstand-voltage MOS transistor 152 switches between the data input buffer 180 and the write circuit 100. Therefore, there is practically no high-withstand-voltage MOS transistor in the write data input path, which enables write data to be input faster and the power consumption to be reduced.

Figure 22:
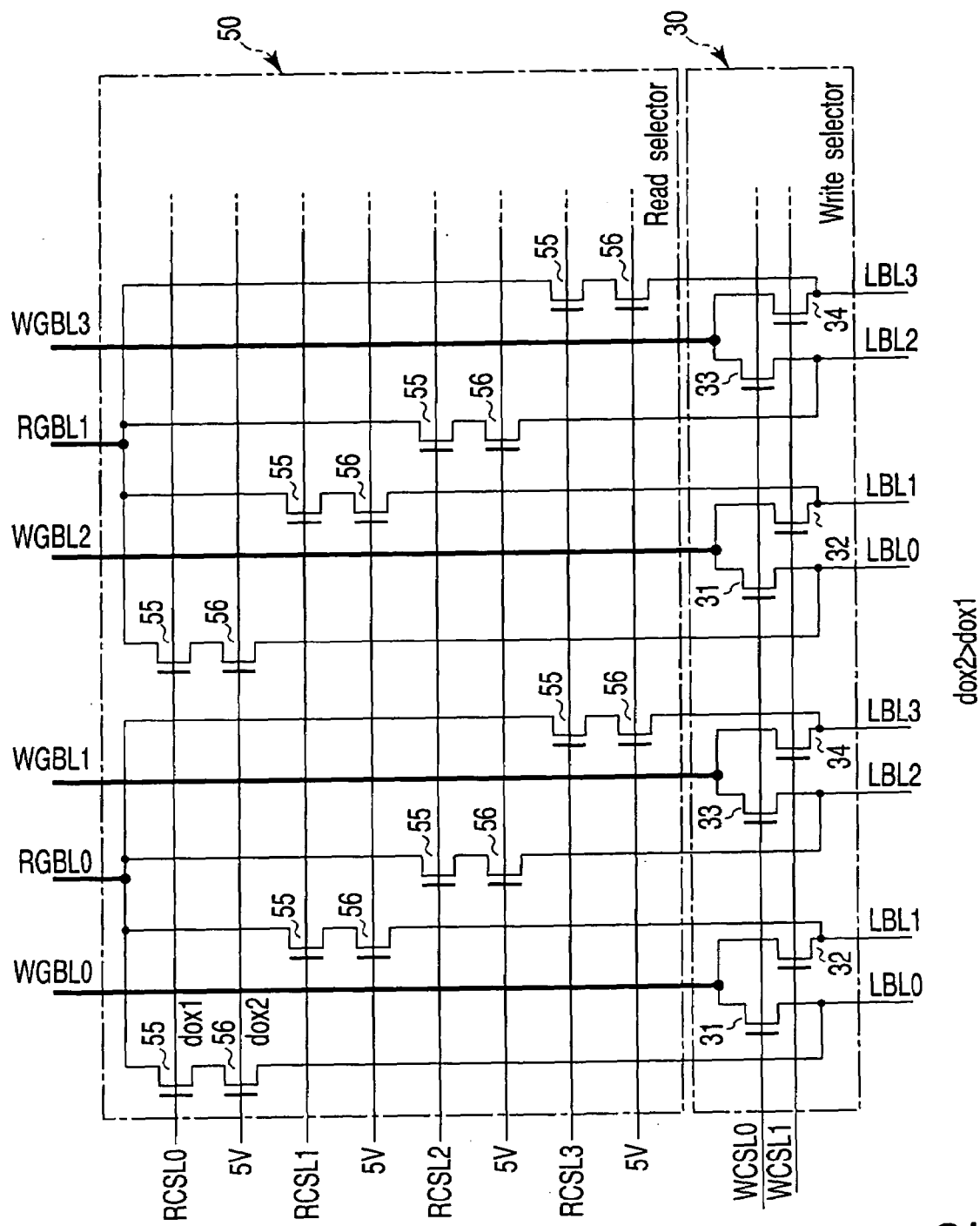
FIG. 22 is a circuit diagram of a part of a flash memory according to a third modification of each of the first to third embodiments.

The same holds true for the read selector 50. Specifically, in the first to third embodiments, each of the MOS transistors 51 to 55 in the read selector 50 may be replaced with two n-channel MOS transistors. FIG. 22 is a circuit diagram of the read selector 50 and write selector 30.

As shown in FIG. 22, each of the MOS transistors 51 is replaced with two MOS transistors 55, 56 connected in series. The MOS transistor 55 is connected to the read global bit line and the MOS transistor 56 is connected to the local bit line. The MOS transistor 55 is a low-withstand-voltage MOS transistor whose gate insulating film dox1 is thin. The MOS transistor 56 is a high-withstand-voltage MOS transistor whose gate insulating film dox2 (dox2>dox1) is thicker than that of the MOS transistor 55. The boosting circuit 160 always applies, for example, 5V to the gate of the MOS transistor 56 in a data latch operation. That is, the MOS transistor does not carry out a switching operation. On the other hand, the gate of the MOS transistor 55 is connected to any one of read column select lines RCSL0 to RCSL3. On the basis of the potentials on read column select lines RCSL0 to RCSL3, the MOS transistor 55 performs a switching operation. During the period excluding the data read operation, the MOS transistor 56 is kept off. Therefore, the negative potential VBB is not applied to the MOS transistor 55.

With this configuration, the high-withstand-voltage MOS transistor 56 does not practically function as a switch element. The low-withstand-voltage MOS transistor 55 switches between the read global bit line and the local bit line. Therefore, there is practically no high-withstand-voltage MOS transistor in the data reading path, which enables data to be read faster and the power consumption to be reduced.

In the first and second embodiments, the write global bit lines are set to 0V immediately before the write data is latched. However, as shown in FIG. 23, the potential on the write global bit line may not be 0V other than immediately after reading is done, or for some reason even immediately after reading is done (FIG. 23 shows a case where the potential on the write global bit line is 0V). In this case, the latch circuit 101 cannot hold "0" data. Therefore, in such a case, as shown in FIG. 24, it is desirable that the write global bit line should be set to 0V by turning on the reset transistor 106 immediately before the write data is latched.

In the cases of FIGS. 23 and 24, the gates of the MOS transistors 106 connected to each of the write global bit lines are all connected to one another. However, in FIG. 23, only a part of the write global bit lines may have to be set to 0V. Therefore, each of the gates of the MOS transistors 106 may be controlled independently as shown in FIG. 25.

Furthermore, in the above embodiments, the bit lines have been hierarchized. Specifically, one write global bit line is provided for every two local bit lines and one read global bit line is provided for every four local bit lines. The number of local bit lines allocated to one write global bit line and to one read global bit line are arbitrary and not restrictive. In addition, the embodiments may be applied to a case where the bit lines are not hierarchized and the latch circuits 101 are provided for the bit lines in a one-to-one correspondence.

In the above embodiments, the n-channel MOS transistors 106 have been used as means for causing the write global bit lines to go to 0V in a read operation. The present invention is not limited to the n-channel MOS transistors. Means other than the n-channel MOS transistors may be used, as long as they can cause the write global bit lines to go to 0V.

Figure 26:
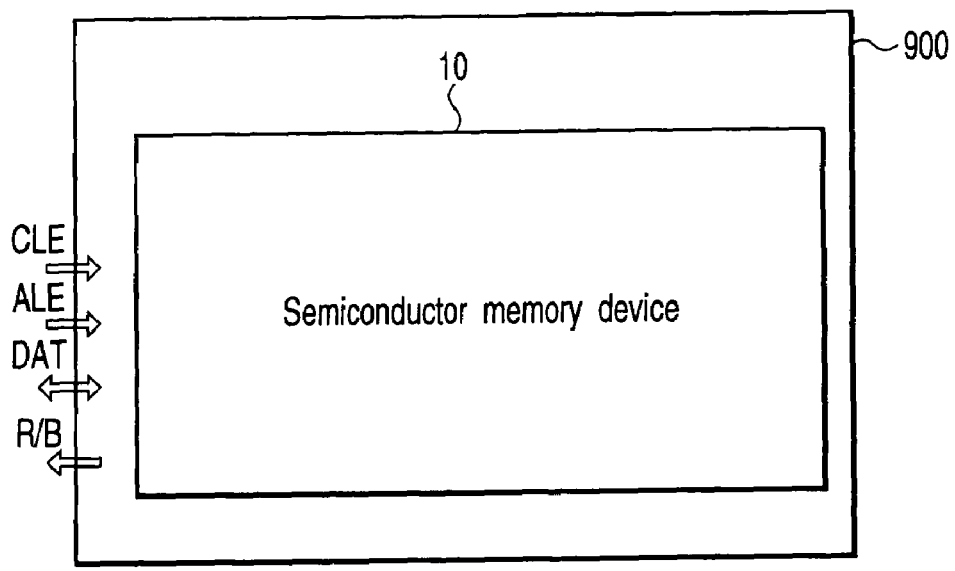
FIG. 26 is a block diagram of a memory card including a flash memory according to each of the first to third embodiments.

Next, an application of the flash memory will be explained. FIG. 26 shows an example of a memory card. As shown in FIG. 26, the memory card 900 includes a flash memory 10 (3Tr-NAND flash memory, NAND flash memory, or 2Tr flash memory) explained in the above embodiments. The flash memory 10 receives specific controls signals and data from an external unit (not shown). In addition, the flash memory 10 outputs specific control signals and data to the external unit.

A signal line (DAT), a command line enable signal line (CLE), an address line enable signal line (ALE) and a ready/busy signal line (R/B) are connected to the memory card 900 having the flash memory 3. The signal line (DAT) transfers data, address or command signals. The command line enable signal line (CLE) transfers a signal, which indicates that a command signal is transferred on the signal line (DAT). The address line enable signal line (ALE) transfers a signal, which indicates that an address signal is transferred on the signal line (DAT). The ready/busy signal line (R/B) transfers a signal, which indicates whether the memory device is ready, or not.

Figure 27:
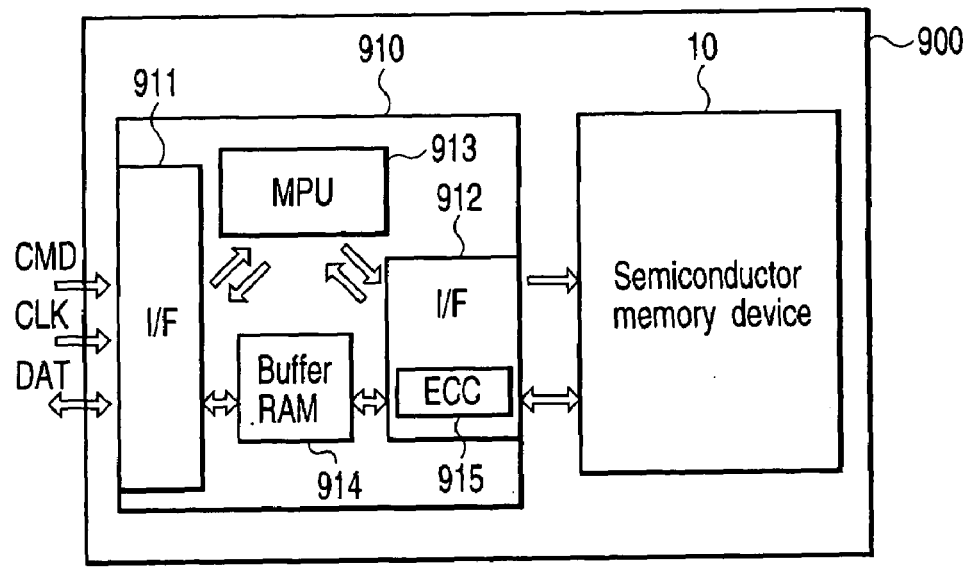
FIG. 27 is a block diagram of a memory card including a flash memory according to each of the first to third embodiments.

Another exemplary implementation is shown in FIG. 27. The memory card shown in FIG. 27 differs from the memory card presented in FIG. 26 in that the memory card of FIG. 27 includes, in addition to the memory device, a controller 910 which controls the flash memory 10 and receives/transfers predetermined signals from/to an external device (not shown).

The controller 910 includes interface units (I/F) 911, 912, a microprocessor unit (MPU) 913, a buffer RAM 914 and an error correction code unit (ECC) 915. The interface units (I/F) 911, 912 receives/outputs predetermined signals from/to an external device (not shown). The microprocessor unit 913 converts a logical address into a physical address. The buffer RAM 914 stores data temporarily. The error correction code unit 915 generates an error correction code. A command signal line (CMD), a clock signal line (CLK) and a signal line (DAT) are connected to the memory card 900. It should be noted that the number of the control signal lines, bit width of the signal line (DAT) and a circuit construction of the controller could be modified suitably.

Figure 28:
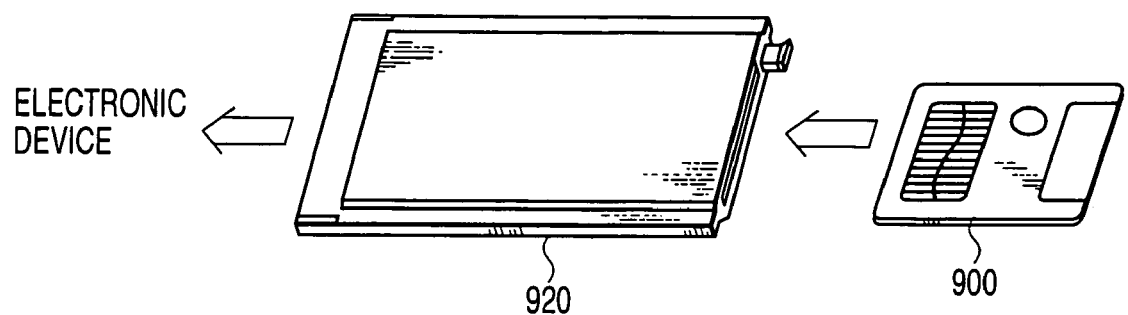
FIG. 28 is an external view of a memory card including a flash memory according to each of the first to third embodiments and a card holder.

FIG. 28 shows another application. As shown in FIG. 28, the memory card 900 is inserted into a cardholder 920, which is then connected to electronic equipment (not shown). The cardholder 920 may have a part of the function of the controller 910.

Figure 29:
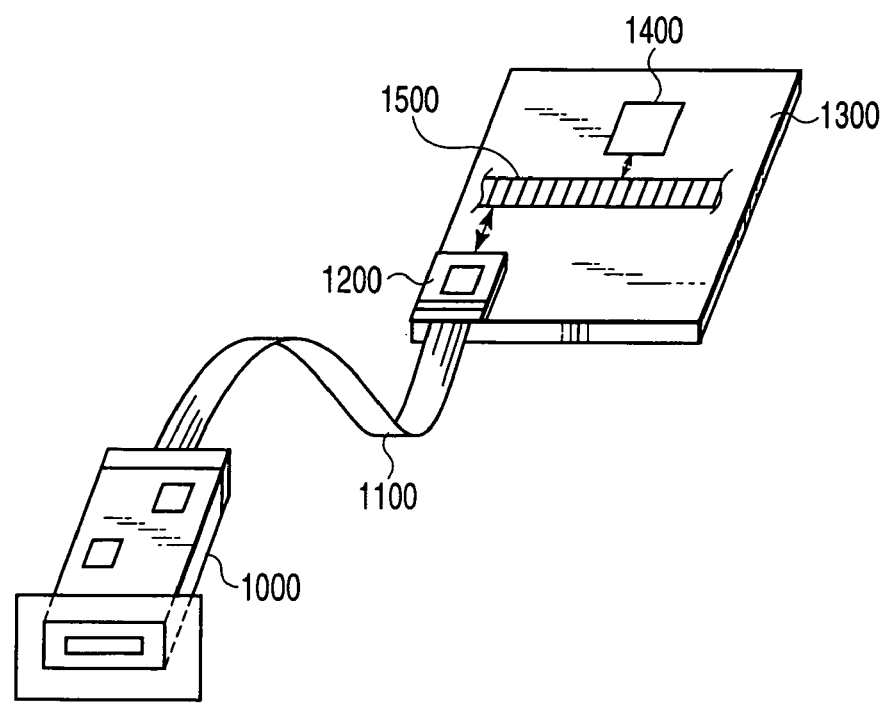
FIG. 29 is an external view of a connector unit which is to connect with a memory card including a flash memory according to each of the first to third embodiments.

FIG. 29 shows another application. As shown in FIG. 29, the memory card 900 or the cardholder 920 in which the memory card 900 has been inserted is inserted into a connection unit 1000. The connection unit 1000 is connected to a board 1300 via a connection cable 1100 and an interface circuit 1200. The board 1300 includes a CPU 1400 and a bus 1500.

Figure 30:
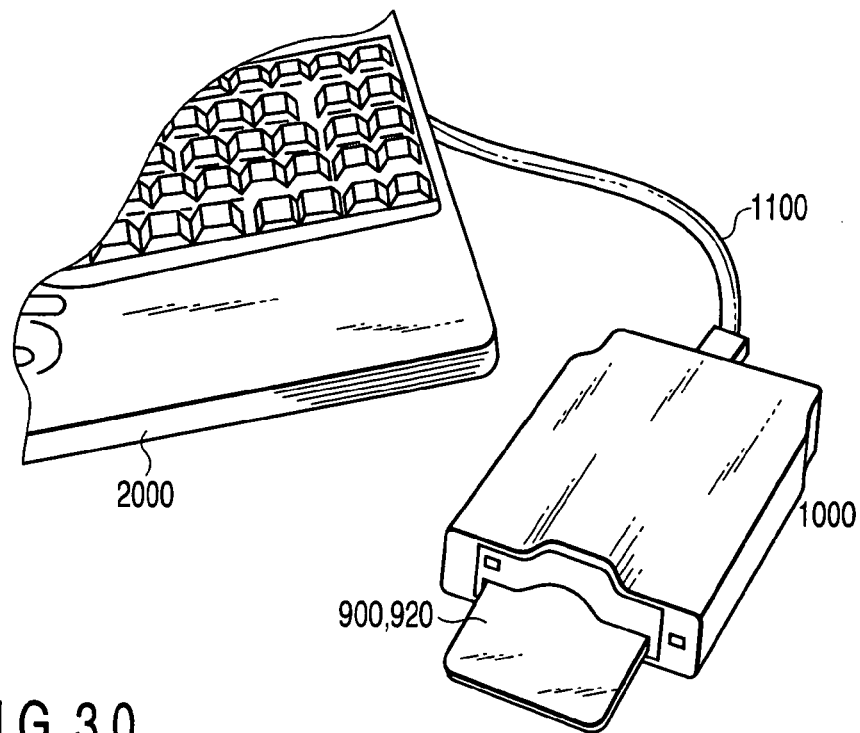
FIG. 30 is an external view of a connector unit which is to connect with a memory card including a flash memory according to each of the first to third embodiments.

FIG. 30 shows another application. The memory card 900 or the cardholder 920 in which the memory card 900 has been inserted is inserted into the connection unit 1000. The connection unit 1000 is connected to a personal computer 2000 via the connection cable 1100.

Figure 31:
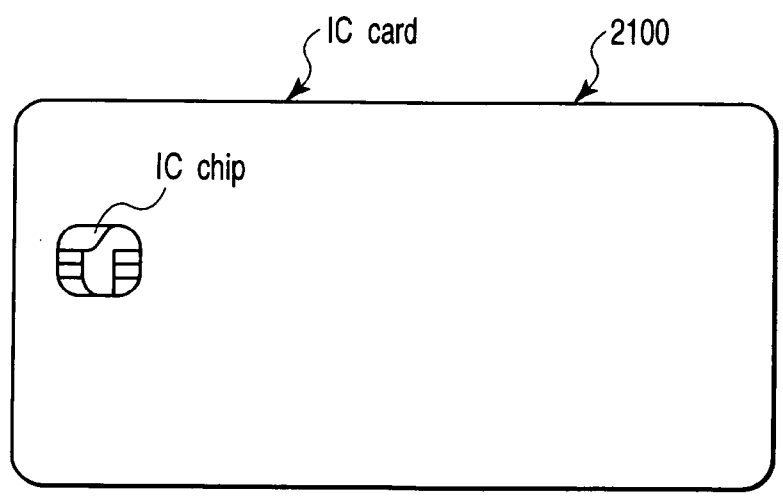
FIG. 31 is an external view of an IC card including a flash memory according to each of the first to third embodiments.
Figure 32:
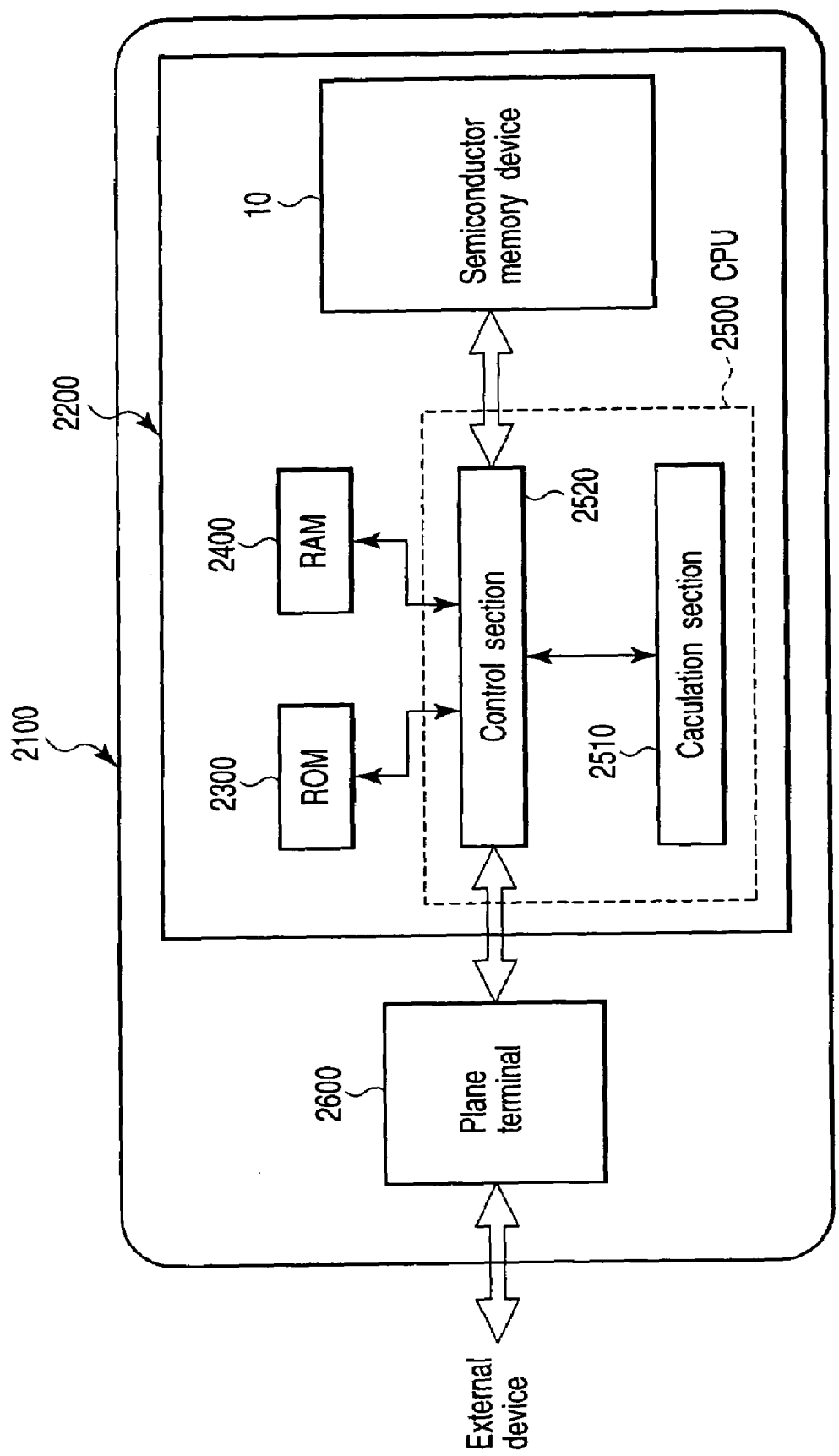
FIG. 32 is a block diagram of an IC card including a flash memory according to each of the first to third embodiments.

FIGS. 31 and 32 show another application. As shown in FIGS. 31 and 32, an IC card 2100 includes an MCU 2200. The MCU 2200 includes the flash memory 10 according to any one of the above embodiments, other circuits, including ROM 2300 and RAM 2400, and a CPU 2500. The IC card 2100 is connectable to the MCU 2200 via a plane connecting terminal 2600 connected to the MCU 2200 and provided on the IC card 2100. The CPU 2500 includes a computing section 2510 and a control section 2520 connected to the flash memory 3, ROM 2300, and RAM 2400. For example, the MPU 2200 is provided on one side of the IC card 2100 and the plane connecting terminal 2600 is provided on the other side.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   memory cells each of which includes a first MOS transistor having a charge accumulation layer and a control gate and into which data is written by exchanging electrons with the charge accumulation layer by FN tunneling, the first MOS transistor having one end of a current path and other end of the current path;
   write bit lines to each of which the one ends of the current paths of the first MOS transistors are connected electrically;
   read bit lines to each of which the one ends of the current paths of the first MOS transistors are connected electrically;
   latch circuits which are provided for the write bit lines in a one-to-one correspondence and which hold write data for the memory cells;
   a n-channel MOS transistor which transfer "1" data to the latch circuit in a data latch operation; and
   voltage setting circuits which apply a potential corresponding to "0" data to the write bit lines in a read operation, in the data latch operation, the latch circuits corresponding to the write bit line connected to the memory cell into which "0" data is to be written latching the potential applied to the write bit lines in the read operation.

2. The semiconductor memory device according to claim 1, wherein the latch circuit operates using a first voltage and a second voltage lower than the first voltage as power supply voltages in a data latch operation and using a third voltage lower than the first voltage and a fourth voltage lower than the third voltage as power supply voltages in a read operation, and
   when writing "1" data into a memory cell in a write operation, the latch circuit applies the third voltage to the write bit lines on the basis of the "1" data transmitted by the n-channel MOS transistors in a data latch operation, and
   when writing "0" data into a memory cell, the latch circuit applies the fourth voltage to the write bit lines on the basis of the potential applied to the corresponding write bit line in a read operation.

3. The semiconductor memory device according to claim 1, wherein the voltage setting circuits are provided for the write bit lines in a one-to-one correspondence and each include a second MOS transistor which has one end of its current path connected to the corresponding write bit line and other end of its current path connected to a ground potential and, in an erase operation and a read operation, make the potential on the write bit line the ground potential.

4. The semiconductor memory device according to claim 1, further comprising a write inhibit control circuit which, in a data latch operation, forces the latch circuits corresponding to the write bit lines on which no data is set in a write operation to hold "1" data.

5. The semiconductor memory device according to claim 1, further comprising:
   local bit lines to each of which the one ends of the current paths of the first MOS transistors are connected; and
   sense amplifiers which amplify read data,
   wherein the write bit lines are connected to the local bit lines via first switch elements,
   the read bit lines are connected to the local bit lines via second switch elements,
   the latch circuits are provided for the write bit lines in a one-to-one correspondence, and
   the sense amplifiers are connected to the read bit lines.

6. The semiconductor memory device according to claim 1, further comprising:
   a write inhibit voltage generating circuit which generates a write inhibit voltage; and
   switch elements which connect the local bit lines to the write inhibit voltage generating circuit,
   wherein the switch elements connect the local bit lines to which unselected memory cells are connected in a write operation to the write inhibit voltage generating circuit.

7. The semiconductor memory device according to claim 2, wherein the second voltage is equal to the third voltage and the fourth voltage is a negative voltage.

8. The semiconductor memory device according to claim 5, wherein each of the memory cells further includes a third MOS transistor which has one end of its current path connected to the other end of the current path of the corresponding one of the first MOS transistors,
   each of the local bit lines is connected to the one ends of the current paths of the corresponding one of the first MOS transistors, and
   the other ends of the current paths of the third MOS transistors are connected to one another.

9. The semiconductor memory device according to claim 1, wherein a negative voltage is applied to the control gates of the first MOS transistors in an erase operation.

10. A method of controlling a semiconductor memory device which comprises a plurality of memory cells each including a first MOS transistor which has a charge accumulation layer and a control gate and writes data by exchanging electrons with the charge accumulation layer by FN tunneling, the method comprising:
    setting to a ground potential the potential on write bit lines each of which connects commonly one ends of current paths of the first MOS transistors;
    reading data from any one of the memory cells in a memory cell array in which the memory cells are arranged in a matrix onto a read bit line which connects commonly the one ends of the current paths of the first MOS transistors;
    latching write data into latch circuits provided so as to correspond to the write bit lines, the latch circuits, when latching "1" data, latching "1" data externally supplied via n-channel MOS transistors, and when latching "0" data, latching the ground potential applied to the write bit lines before reading data; and
    writing the write data into any one of the memory cells connected to the write bit lines according to the write data latched in a write circuit.

11. The method according to claim 10, wherein the latch circuit operates using a first voltage and a second voltage lower than the first voltage as power supply voltages when latching write data and using a third voltage lower than the first voltage and a fourth voltage lower than the third voltage as power supply voltages when writing write data, and
    the latch circuit holding "1" data applies the third voltage to the write bit line and the latch circuit holding "0" data applies the fourth voltage to the write bit line.

12. A memory card comprising a semiconductor memory device recited in claim 1.

13. The memory card according to claim 12, further comprising a control circuit which controls the semiconductor memory device.

* * * * *